United States Patent
Arai

(10) Patent No.: US 11,486,558 B2
(45) Date of Patent: Nov. 1, 2022

(54) LIGHT-EMITTING DEVICE

(71) Applicant: PIONEER CORPORATION, Tokyo (JP)

(72) Inventor: Kazuaki Arai, Kawagoe (JP)

(73) Assignee: PIONEER CORPORATION, Tokyo (JP)

(*) Notice: Subject to any disclaimer, the term of this patent is extended or adjusted under 35 U.S.C. 154(b) by 314 days.

(21) Appl. No.: 16/630,792

(22) PCT Filed: Jun. 28, 2018

(86) PCT No.: PCT/JP2018/024625
§ 371 (c)(1),
(2) Date: Jan. 13, 2020

(87) PCT Pub. No.: WO2019/013010
PCT Pub. Date: Jan. 17, 2019

(65) Prior Publication Data
US 2021/0116095 A1    Apr. 22, 2021

(30) Foreign Application Priority Data
Jul. 13, 2017   (JP) .............................. JP2017-136757

(51) Int. Cl.
*F21S 43/145*   (2018.01)
*F21S 43/19*    (2018.01)
*H01L 51/00*    (2006.01)

(52) U.S. Cl.
CPC ............. *F21S 43/145* (2018.01); *F21S 43/19* (2018.01); *H01L 51/0097* (2013.01)

(58) Field of Classification Search
CPC ...... F21S 43/145; F21S 43/19; H01L 51/0097
See application file for complete search history.

(56) References Cited

U.S. PATENT DOCUMENTS

2014/0003072 A1* 1/2014 Yamamoto ............... B60J 5/107
                                                             362/503
2015/0274064 A1  10/2015 Iyoda et al.
2019/0054853 A1   2/2019 Tan et al.

FOREIGN PATENT DOCUMENTS

JP    H05-56625 U     7/1993
JP    H07-041835 U    7/1995
(Continued)

OTHER PUBLICATIONS

Office Action dated Apr. 29, 2021 from corresponding Korean Patent Application No. 10-2020-7002612, 6 pages.
(Continued)

*Primary Examiner* — Anne M Hines
(74) *Attorney, Agent, or Firm* — Procopio, Cory, Hargreaves & Savitch LLP

(57) ABSTRACT

A light-emitting device (20) includes a light-emitting region (140). The light-emitting region (140) includes a plurality of light-emitting units (142) and a plurality of light-transmitting units (144), and each of the plurality of light-transmitting units (144) is located between the light-emitting elements (142) adjacent to each other. The light-emitting region (140) is located on a side of one surface (outer surface (202)) of a base material (200) having light-transmitting properties and has an inclination with respect to the one surface (outer surface (202)). The base material (200) is rear glass of an automobile. The base material (200) partitions a region outside a mobile object (region (RG1)) from a region inside the mobile object (region (RG2)).

20 Claims, 18 Drawing Sheets

(56) References Cited

FOREIGN PATENT DOCUMENTS

| | | | |
|---|---|---|---|
| JP | H08324337 | A | 12/1996 |
| JP | H11-198720 | A | 7/1999 |
| JP | 2004123029 | A | 4/2004 |
| JP | 2011-150887 | A | 8/2011 |
| JP | 2014-008877 | A | 1/2014 |
| JP | 2015-076294 | A | 4/2015 |
| JP | 2015-195173 | A | 11/2015 |
| JP | 2015-198011 | A | 11/2015 |
| JP | 2017-103049 | A | 6/2017 |
| JP | 2017-208226 | A | 11/2017 |
| JP | 2018-045964 | A | 3/2018 |
| JP | 2018-073690 | A | 5/2018 |
| WO | 2013/088572 | A1 | 6/2013 |
| WO | 2017/073459 | A1 | 5/2017 |
| WO | 2018/139037 | A1 | 8/2018 |

OTHER PUBLICATIONS

International Search Report for related International Application No. PCT/JP2018/024625, dated Oct. 2, 2018; 2 pages.
Office Action dated Dec. 10, 2021 from corresponding Chinese Patent Application No. 201880046353.1, 5 pages.

* cited by examiner

LIGHT-EMITTING DEVICE

CROSS-REFERENCE TO RELATED APPLICATIONS

This application is a U.S. National Stage entry of PCT Application No: PCT/JP2018/024625 filed Jun. 28, 2018, which claims priority to Japanese Patent Application No. 2017-136757, filed Jul. 13, 2017, the contents of which are incorporated herein by reference.

TECHNICAL FIELD

The present invention relates to a light-emitting device.

BACKGROUND ART

In recent years, organic light-emitting diodes (OLEDs) have been developed as light-emitting devices. The OLED includes a first electrode, an organic layer, and a second electrode, and light is emitted by organic electroluminescence (EL) from the organic layer by voltage between the first electrode and the second electrode.

As described in Patent Documents 1-3, the OLED may be attached along the rear glass of an automobile in the interior of the automobile. Thus, the OLED functions as a marker light. Particularly, the OLED in Patent Document 1 has light-transmitting properties, and the outside of the automobile can be seen from the inside of the automobile through the OLED.

RELATED ART DOCUMENT

Patent Document
[Patent Document 1]: Japanese Unexamined Patent Application Publication No. 2015-195173
[Patent Document 2]: Japanese Unexamined Patent Application Publication No. 2015-76294
[Patent Document 3]: Japanese Unexamined Patent Application Publication No. H11-198720

SUMMARY OF THE INVENTION

The present inventor conducted studies to provide an OLED having light-transmitting properties on a light-transmitting base material (for example, rear glass of an automobile). The present inventor found that, when the OLED is attached along a surface of the base material, the emission direction of light emitted from the OLED is determined depending on the orientation of the surface of the base material.

An example of the problem to be solved by the present invention is to determine an emission direction of light emitted from an OLED without depending on an orientation of a surface of the base material.

Means for Solving the Problem

The invention described in claim 1 is a light-emitting device including:
a first light-emitting region including a plurality of light-emitting units, and a plurality of light-transmitting units, each of the light-transmitting units located between the light-emitting units adjacent to each other,
in which the first light-emitting region is located on a first surface side of a light-transmitting member of a mobile object, emits light toward an outside of the mobile object, and has an inclination with respect to the first surface.

The invention described in claim 20 is a light-emitting device including:
a first light-emitting region including a plurality of light-emitting units emitting light and a light-transmitting unit located between the light-emitting units adjacent to each other,
in which the first light-emitting region is located on a first surface side of a base material having light-transmitting properties and has an inclination with respect to the first surface of the base material.

BRIEF DESCRIPTION OF DRAWINGS

The objects described above, and other objects, features and advantages are further made apparent by suitable embodiments that will be described below and the following accompanying drawings.

DESCRIPTION OF EMBODIMENTS

Figure 1:
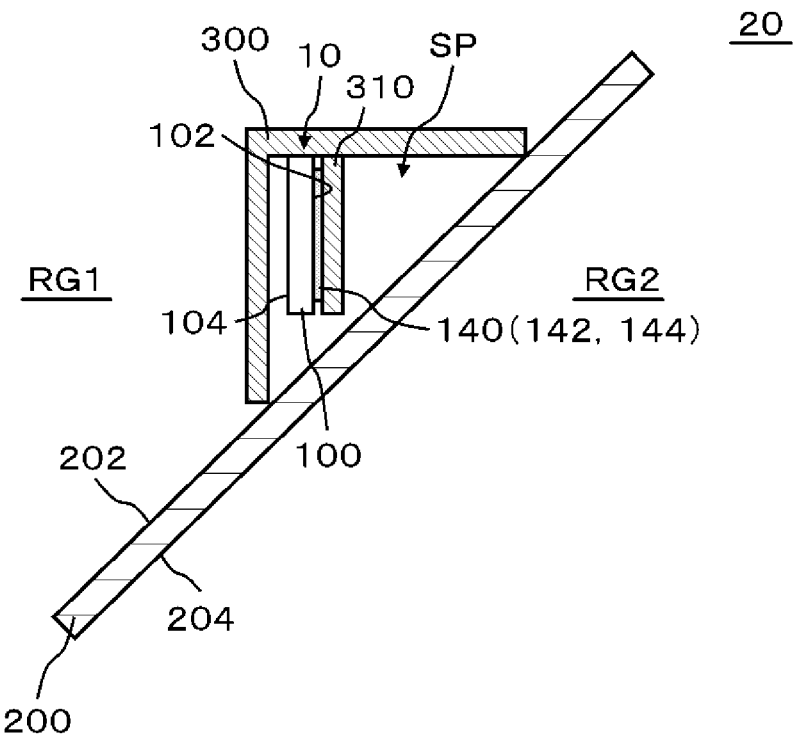
FIG. 1 is a side view of a light-emitting device according to a first embodiment.

Embodiments of the present invention will be described below by referring to the drawings. Moreover, in all the drawings, the same constituent elements are given the same reference numerals, and descriptions thereof will not be repeated.

First Embodiment

Figure 2:
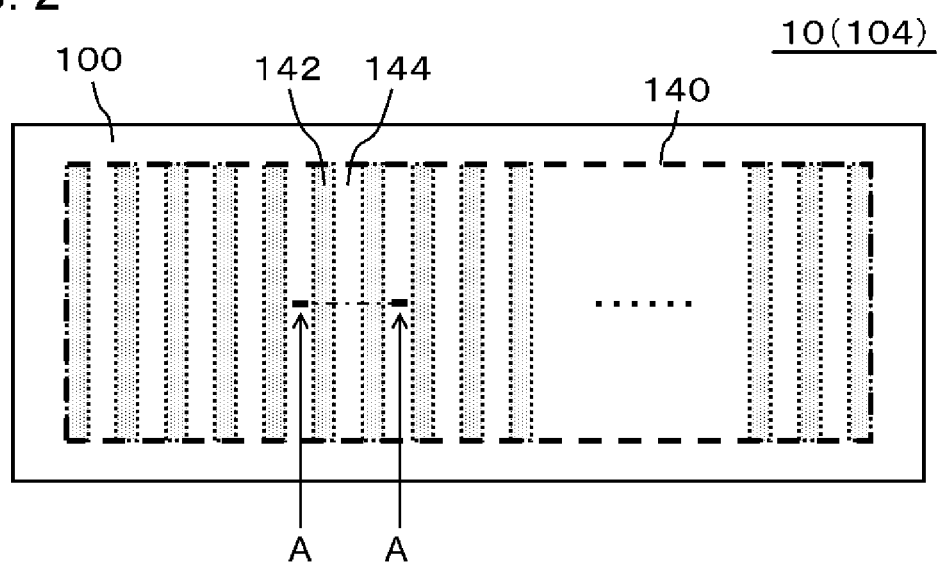
FIG. 2 is a plan view of a light-emitting member shown in FIG. 1 when viewed from a second surface side of a substrate.
Figure 3:
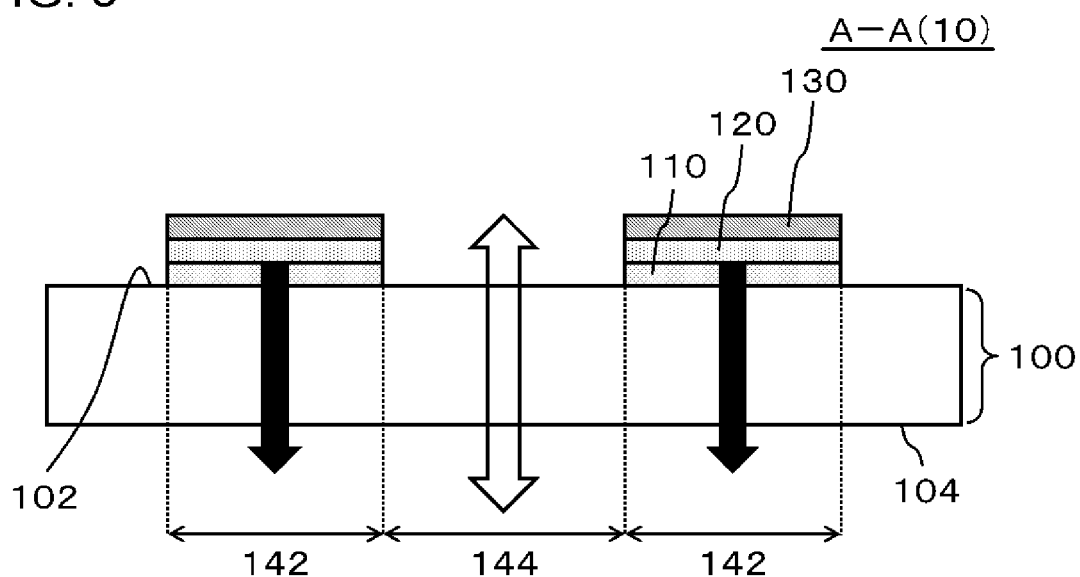
FIG. 3 is a cross-sectional view taken along line A-A of FIG. 2.

FIG. 1 is a side view of a light-emitting device 20 according to the first embodiment. FIG. 2 is a plan view of a light-emitting member 10 shown in FIG. 1 when viewed from a second surface 104 side of a substrate 100. FIG. 3 is a cross-sectional view taken along line A-A of FIG. 2.

A summary of the light-emitting system 20 is explained using FIG. 1. The light-emitting device 20 includes a light-emitting region 140. To be described later using FIG. 2, the light-emitting region 140 (first light-emitting region) includes a plurality of light-emitting units 142 and a plurality of light-transmitting units 144, and each of the plurality of light-transmitting units 144 is located between the light-emitting elements 142 adjacent to each other. The light-emitting region 140 is located on one surface (first surface) of a base material 200 having light-transmitting properties. Particularly, the light-emitting region 140 is located on an outer surface 202 side in the example shown in FIG. 1 and has an inclination with respect to the one surface (the outer surface 202 in the example shown in FIG. 1).

Particularly in the example shown in FIG. 1, the base material 200 is glass of a mobile object, and more specifically, the rear glass of an automobile. The base material 200 partitions a region outside the mobile object (region RG1) from a region inside the mobile object (region RG2). The outer surface 202 of the base material 200 is located on the region RG1 side, and an inner surface 204 of the base material 200 faces the region RG2 side. The light-emitting region 140 emits light toward the outside of the mobile object (that is, toward the region RG1).

According to the configuration described above, the emission direction of light emitted from the light-emitting region 140 can be determined without depending on the orientation of the outer surface 202 of the base material 200. Specifically, the light-emitting region 140 is located on the outer surface 202 side of the base material 200 and has an inclination with respect to the outer surface 202 of the base material 200. That is, the light-emitting region 140 is not along the outer surface 202 of the base material 200. Therefore, the emission direction of light emitted from the light-emitting region 140 can be determined without depending on the orientation of the outer surface 202 of the base material 200.

The mobile object in which the light-emitting member 10 is used is not limited to an automobile and may include, for example, a train, a vessel, and an airplane.

When the mobile object in which the light-emitting member 10 is used is an automobile, the base material 200 is not limited to the rear glass, and may be, for example, a windshield or side glass.

A detailed description of the light-emitting member 10 will be provided below using FIG. 2 and FIG. 3. In the example shown in FIG. 2 and FIG. 3, the light-emitting member 10 is a bottom-emission type, and light emitted from the light-emitting unit 142 passes through the substrate 100 and is emitted therefrom. In another example, the light-emitting member 10 may be a top-emission type.

Details of a plan layout of the light-emitting member 10 will be described using FIG. 2.

The light-emitting member 10 includes the substrate 100 and the light-emitting region 140. The light-emitting region 140 includes the plurality of light-emitting units 142 and the plurality of the light-transmitting units 144.

In the example shown in FIG. 2, the shape of the substrate 100 is a rectangle having a pair of long sides and a pair of short sides. Meanwhile, the shape of the substrate 100 is not limited to the example shown in FIG. 2.

The light-emitting region 140 extends in a planar shape, and in the example shown in FIG. 2, the shape of the light-emitting region 140 is a rectangle having a pair of long sides and a pair of short sides. Particularly in the example shown in FIG. 2, the plurality of light-emitting units 142 and the plurality of light-transmitting units 144 extend in the extending direction of the short sides of the substrate 100, and are aligned in the extending direction of the long sides of the substrate 100. Meanwhile, the shape of the light-emitting region 140 is not limited to the example shown in FIG. 2.

Details of the cross-sectional structure of the light-emitting member 10 will be described using FIG. 3.

The light-emitting member 10 includes the substrate 100, a first electrode 110, an organic layer 120, and a second electrode 130.

The substrate 100 includes a first surface 102 and a second surface 104. The second surface 104 is on the opposite side of the first surface 102. The first electrode 110, the organic layer 120, and the second electrode 130 are located on the first surface 102 side of the substrate 100.

The substrate 100 is composed of an insulating material having light-transmitting properties. In one example, the substrate 100 may be formed of glass or a resin (for example, polyethylene naphthalate (PEN), polyether sulphone (PES), polyethylene terephthalate (PET), or polyimide.)

The substrate 100 may or may not have flexibility. In a case where the substrate 100 is formed of a resin, the substrate 100 may have flexibility.

The first electrode 110 is composed of a material having conductivity and light-transmitting properties. In one example, the first electrode 110 includes a metal oxide, and more specifically, an indium tin oxide (ITO), an indium zinc oxide (IZO), an indium tungsten zinc oxide (IWZO), or a zinc oxide (ZnO). In another example, the first electrode 110 may include a conductive organic material, and more specifically, carbon nanotubes or PEDOT/PSS.

The organic layer 120 includes a material which emits light by organic EL. In one example, the organic layer 120 includes a hole injection layer (HIL), a hole transport layer (HTL), a light-emitting layer (EML), an electron transport layer (ETL), and an electron injection layer (EIL) in this order from the first electrode 110 side to the second electrode 130 side. A hole is injected from the first electrode 110 to the EML via the HIL and the HTL, and an electron is injected from the second electrode 130 to the EML via the EIL and the ETL. The hole and the electron are recombined in the EML, thereby emitting light.

The second electrode 130 is composed of a material having conductivity and light shielding properties, and particularly, has light reflectivity. In one example, the second electrode 130 is composed of a metal, and more specifically, a metal selected from the group consisting of Al, Au, Ag, Pt, Mg, Sn, Zn, and In, or an alloy of metals selected from this group.

The light-emitting unit 142 is composed of a laminated structure which includes the first electrode 110, the organic layer 120, and the second electrode 130 laminated in this order from the first surface 102 of the substrate 100. As shown with a black arrow in FIG. 3, in the light-emitting unit 142, light emitted from the organic layer 120 is transmitted through the first electrode 110 and then the substrate 100, and is emitted from the second surface 104 of the substrate 100. Even when light emitted from the organic layer 120 is directed toward the second electrode 130 side, this light is reflected toward the first electrode 110 side by the second electrode 130.

The light-transmitting unit 144 is not overlapped with a light shielding member, and particularly in the example shown in FIG. 3, not overlapped with the second electrode 130. Therefore, as shown with a white arrow in FIG. 3, light from the outside can be transmitted through the light-transmitting unit 144.

Details of the light-emitting device 20 will be described using FIG. 1.

The light-emitting device 20 includes the light-emitting member 10, the base material 200, and a cover 300.

The base material 200 has light-transmitting properties, and specifically, is glass. In another example, the base material 200 may be a resin base material such as an acrylic resin, a polycarbonate resin, or the like. In the example shown in FIG. 1, the base material 200 is a light-transmitting member of an automobile (specifically, rear glass), and partitions a space outside the automobile (region RG1) from a space inside the automobile (region RG2). The base material 200 includes the outer surface 202 and the inner surface 204. The outer surface 202 of the base material 200 faces the region RG1 side, and the inner surface 204 of the base material 200 faces the region RG2 side.

The cover 300 is installed on the outer surface 202 of the base material 200, and located on the side of the light-emitting region 140 opposite to the base material 200. The cover 300 defines a space SP along with a portion of the outer surface 202 of the base material 200. Specifically, the upper surface and a side of the space SP are defined by the cover 300, and the bottom surface of the space SP is defined by the outer surface 202 of the base material 200.

The light-emitting member 10 is located outside the automobile, and particularly, in the space SP. Therefore, the light-emitting member 10 is protected from the external environment of the space SP by the cover 300. Specifically, the cover 300 protects the light-emitting member 10, for example, from wind pressure which occurs along with the movement of the automobile or from weather conditions outside the automobile (for example, rain, wind, snow, or sun light).

In the space SP, the light-emitting member 10 is disposed so that the second surface 104 of the substrate 100 faces the region RG1 side and the first surface 102 of the substrate 100 faces the region RG2 side. Particularly, the substrate 100 has an inclination with respect to the outer surface 202 of the base material 200. In the example shown in FIG. 1, the short side direction of the light-emitting region 140 shown in FIG. 2 is along the height direction of the automobile. Light emitted from the light-emitting region 140 of the light-emitting member 10 is transmitted through the substrate 100 and the cover 300 and emitted to the region RG1. In the example shown in FIG. 1, the first electrode 110, the organic layer 120, and the second electrode 130 shown in FIG. 3 are aligned in a direction from the region RG1 side (outside the automobile) toward the region RG2 side (inside the automobile).

In the space SP, a support plate 310 hangs down from the cover 300, and the light-emitting member 10 is disposed so that the second surface 104 of the substrate 100 faces the support plate 310. In one example, the second surface 104 of the substrate 100 may be attached to the support plate 310 with an adhesive. In another example, the second surface 104 of the substrate 100 may be mechanically fixed to the support plate 310 by, for example, a screw. The light-emitting device 10 is installed on the cover 300 side. Therefore, the light-emitting device 10 can be easily attached to or detached from the rear glass.

From the viewpoint of protecting the light-emitting member 10 from the external environment of the space SP, the cover 300 is preferably composed of a material having corrosion resistance. Further, from the viewpoint of transmitting light emitted from the light-emitting device 10 through the cover 300, the cover 300 is preferably composed of a material having light-transmitting properties. In one example, the cover 300 is composed of a transparent resin, for example, an acrylic resin or a polycarbonate.

Figure 4:
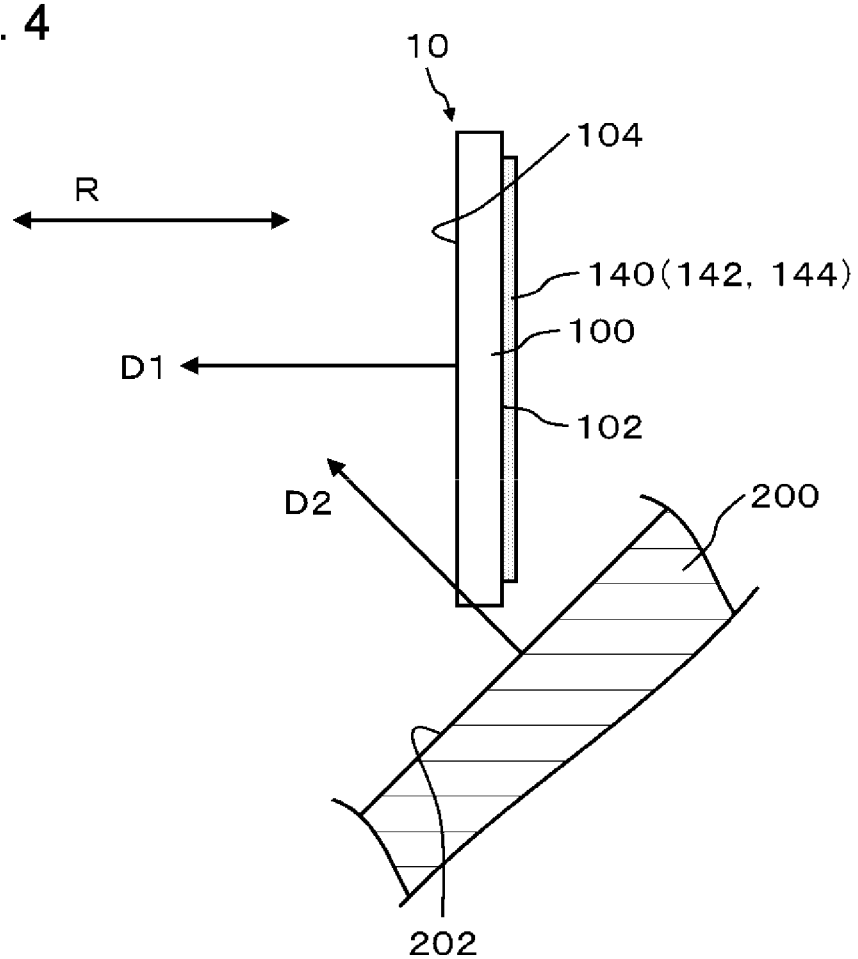
FIG. 4 is a diagram to explain details of the relation between the light-emitting member and the base material shown in FIG. 1.

FIG. 4 is a diagram to explain details of the relation between the light-emitting device 10 and the base material 200 shown in FIG. 1.

In FIG. 4, a direction D1 shows the direction in which the light distribution of light emitted from the light-emitting region 140 (plurality of light-emitting units 142) has a peak, and particularly in the example shown in FIG. 4, the direction D1 shows the normal direction of the second surface 104 of the substrate 100. A direction D2 shows the normal direction of the outer surface 202 of the base material 200. A reference axis R shows an axis along the traveling direction of the automobile.

The base material 200 is more transversely laid than the light-emitting member 10, that is, than the substrate 100 and the light-emitting region 140, from a direction perpendicular to the reference axis R. Therefore, the direction D1 is oriented closer to the reference axis R than the direction D2, and particularly in the example shown in FIG. 4, the direction D1 is along the reference axis R.

The light-emitting device 10 (light-emitting region 140) functions as a high-mount stop-lamp (HMSL) of the automobile, and emits red light toward the back of the automobile (that is, along the reference axis R). In one example, a light distribution of light emitted from the light-emitting region 140 has a peak at an angle of equal to or less than 10° vertically and horizontally from the reference axis R.

Figure 5:
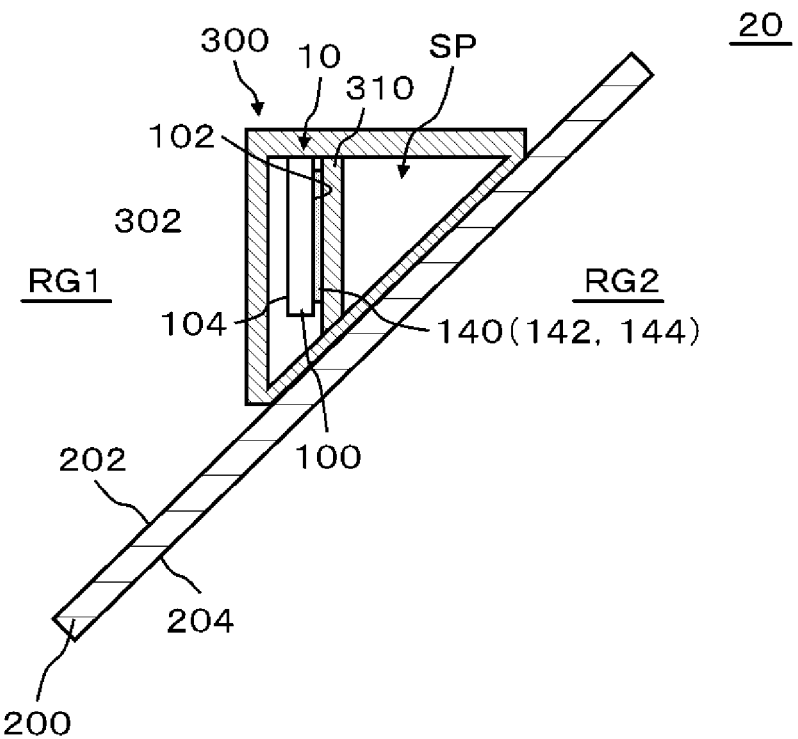
FIG. 5 is a diagram of a first modification example of FIG. 1.

FIG. 5 is a diagram of a first modification example of FIG. 1.

The cover 300 includes a portion which extends along the outer surface 202 of the base material 200. Therefore, the support plate 310 can be supported by the cover 300 from both of an upper portion and a lower portion of the support plate 310. Thereby, the light-emitting device 10 can be stably fixed.

Figure 6:
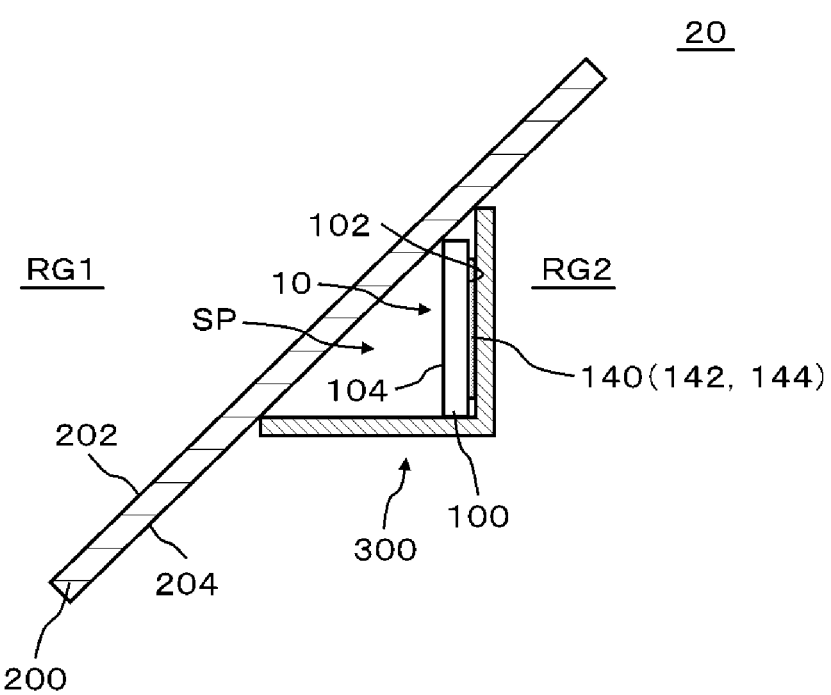
FIG. 6 is a diagram of a second modification example of FIG. 1.

FIG. 6 is a diagram of a second modification example of FIG. 1.

The light-emitting device 10 is located on the region RG2 side, that is, inside an automobile. The cover 300 is also located on the region RG2 side, that is, inside the automobile, and supports the light-emitting device 10.

The light-emitting device 10 is located on one surface (first surface) of the base material 200, and particularly, in the example shown in FIG. 6, on the inner surface 204 side, and has an inclination with respect to the one surface (inner surface 204 in the example shown in FIG. 6). Therefore, the emission direction of light emitted from the light-emitting region 140 can be determined without depending on the orientation of the inner surface 204 of the base material 200.

As described above, according to the present embodiment, the emission direction of light emitted from the light-emitting region 140 can be determined without depending on the orientation of a surface of the base material 200.

Second Embodiment

Figure 7:
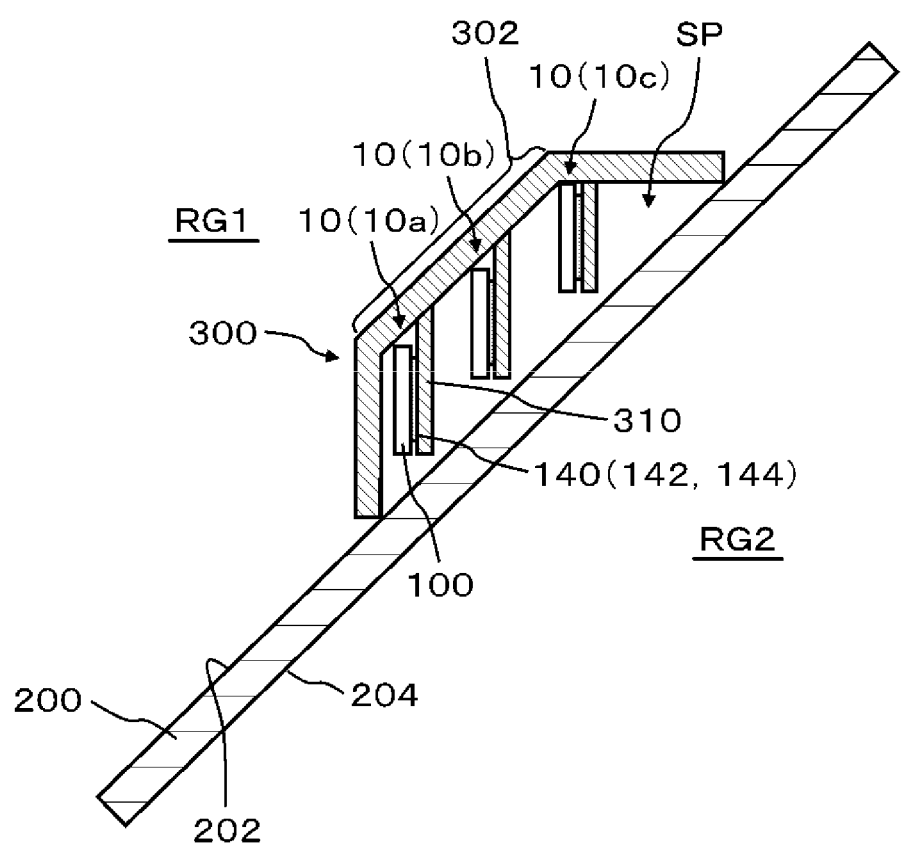
FIG. 7 is a side view of a light-emitting device according to a second embodiment.

FIG. 7 is a side view of the light-emitting device 20 according to the second embodiment, and corresponds to FIG. 1 of the first embodiment. The light-emitting device 20 according to the present embodiment is the same as the light-emitting device 20 according to the first embodiment except the following.

The light-emitting device 20 includes a plurality of light-emitting members 10, particularly in the example shown in FIG. 7, a first light-emitting member 10a, a second light-emitting member 10b, and a third light-emitting member 10c. As is the case with the light-emitting member 10 shown in FIG. 1, each of the light-emitting members 10 includes the substrate 100 and the light-emitting region 140. The light-emitting region 140 of the first light-emitting member 10a, the light-emitting region 140 of the second light-emitting member 10b, and the light-emitting region 140 of the third light-emitting member 10c are aligned in order from the bottom to the top along the outer surface 202 of the base material 200. The substrate 100 of each light-emitting member 10 has an inclination with respect to the outer surface 202 of the base material 200, thus, the light-emitting region 140 of each light-emitting member 10 has an inclination with respect to the outer surface 202 of the base material 200. Therefore, an emission direction of light emitted from the light-emitting region 140 of each light-emitting member 10 can be determined without depending on the orientation of the outer surface 202 of the base material 200.

According to the configuration described above, it is possible to provide the plurality of light-emitting regions 140 with a stereoscopic feeling when viewed from the back of the automobile (that is, the region RG1 side). Specifically, the light-emitting region 140 of the first light-emitting member 10a, the light-emitting region 140 of the second light-emitting member 10b, and the light-emitting region 140 of the third light-emitting member 10c are aligned along the outer surface 202 of the base material 200. Therefore, respective ones of light-emitting regions 140 are located shifted from each other along the direction from the front to the back of the automobile. Therefore, it is possible to provide a stereoscopic feeling to the plurality of light-emitting regions 140 when viewed from the back of the automobile (that is, the region RG1 side).

In order to make the stereoscopic feeling of the plurality of light-emitting regions 140 conspicuous, the luminance of each light-emitting region 140 may be made different from each other. In one example, the luminance of the plurality of light-emitting regions 140 may be decreased or increased from the first light-emitting member 10a toward the third light-emitting member 10c.

As is the case with the example shown in FIG. 1, the cover 300 defines the space SP, and the first light-emitting member 10a, the second light-emitting member 10b, and the third light-emitting member 10c are located in the space SP. Therefore, each light-emitting member 10 can be protected from the external environment of the space SP.

In the example shown in FIG. 7, the projection of the cover 300 can be reduced from the outer surface 202 of the base material 200. Specifically, in the example shown in FIG. 7, the first light-emitting member 10a, the second light-emitting member 10b, and the third light-emitting member 10c are aligned along the outer surface 202 of the base material 200, that is, it can be said that one light-emitting region that is long in the vertical direction is divided by three light-emitting regions 140. When the one light-emitting region that is long in the vertical direction is covered by the cover 300, for example, as shown in FIG. 1, the projection of the cover 300 is prominent from the outer surface 202 of the base material 200. In contrast, in the example shown in FIG. 7, at least a portion of the cover 300, specifically, a portion 302 in the drawing, can be located along the outer surface 202 of the base material 200. Therefore, the projection of the cover 300 can be reduced from the outer surface 202 of the base material 200.

Figure 8:
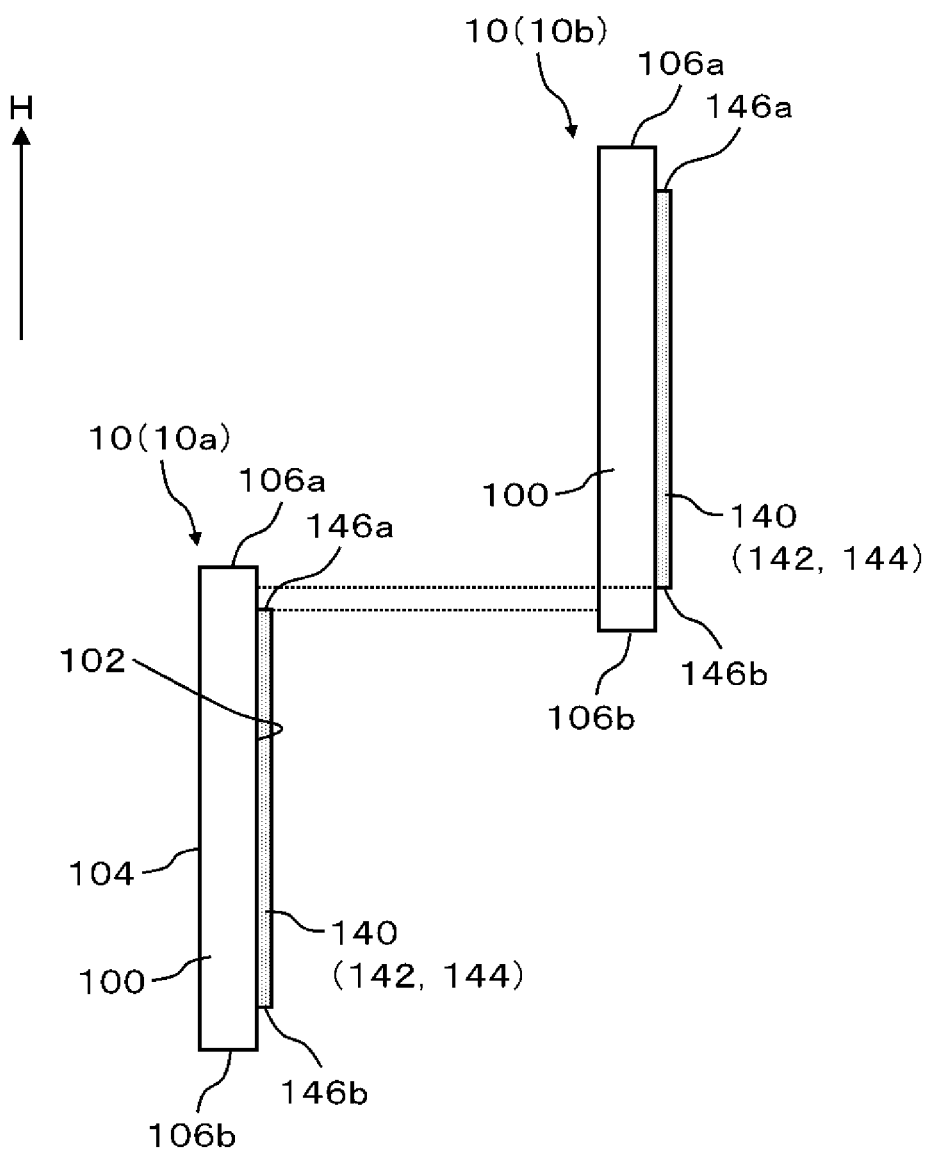
FIG. 8 is a diagram to explain a first example of the relation between a first light-emitting member and a second light-emitting member shown in FIG. 7.

FIG. 8 is a diagram to explain a first example of the relation between the first light-emitting member 10a and the second light-emitting member 10b shown in FIG. 7.

When viewed from the normal direction of the light-emitting region 140 of the first light-emitting member 10a, the light-emitting region 140 of the first light-emitting member 10a and the light-emitting region 140 of the second light-emitting member 10b are aligned in one direction (direction H in the drawing).

The substrate 100 of each light-emitting member 10 includes a first edge 106a and a second edge 106b. The second edge 106b is on the opposite side of the first edge 106a, and the first edge 106a and the second edge 106b are aligned in the direction H.

The light-emitting region 140 of each light-emitting member 10 includes a first edge 146a and a second edge 146b. The second edge 146b is on the opposite side of the first edge 146a, and the first edge 146a and the second edge 146b are aligned in the direction H. The first edge 146a and the second edge 146b of light-emitting regions 140 are along the first edge 106a and the second edge 106b of the substrate 100, respectively.

The first edge 146a of the light-emitting region 140 of the first light-emitting member 10a and the second edge 146b of the light-emitting region 140 of the second light-emitting member 10b are located between the second edge 146b of the light-emitting region 140 of the first light-emitting member 10a and the first edge 146a of the light-emitting region 140 of the second light-emitting member 10b.

In the direction H, the light-emitting region 140 of the first light-emitting member 10*a* and the light-emitting region 140 of the second light-emitting member 10*b* are in proximity of each other. Therefore, a non-light-emitting region between the light-emitting region 140 of the first light-emitting member 10*a* and the light-emitting region 140 of the second light-emitting member 10*b* can be made less noticeable from the back of the automobile. Specifically, in the direction H, the second edge 146*b* of the light-emitting region 140 of the second light-emitting member 10*b* is located shifted from the first edge 106*a* of the substrate 100 of the first light-emitting member 10*a* toward the side of the second edge 146*b* of the light-emitting region 140 of the first light-emitting member 10*a*. Particularly in the example shown in FIG. 8, the second edge 146*b* of the light-emitting region 140 of the second light-emitting member 10*b* is located between the first edge 106*a* and the first edge 146*a* of the first light-emitting member 10*a*. As is the case with the example above, in the direction H, the first edge 146*a* of the light-emitting region 140 of the first light-emitting member 10*a* is located shifted from the second edge 106*b* of the substrate 100 of the second light-emitting member 10*b* toward the first edge 146*a* side of the light-emitting region 140 of the second light-emitting member 10*b*. Particularly in the example shown in FIG. 8, the first edge 146*a* of the light-emitting region 140 of the first light-emitting member 10*a* is located between the second edge 106*b* and the second edge 146*b* of the second light-emitting member 10*b*.

In another example, the second edge 146*b* of the light-emitting region 140 of the second light-emitting member 10*b* may be aligned with the first edge 106*a* of the substrate 100 of the first light-emitting member 10*a* in the direction H. As is the case with the example above, the first edge 146*a* of the light-emitting region 140 of the first light-emitting member 10*a* may be aligned with the second edge 106*b* of the substrate 100 of the second light-emitting member 10*b* in the direction H. In this example also, in the direction H, the light-emitting region 140 of the first light-emitting member 10*a* and the light-emitting region 140 of the second light-emitting member 10*b* are in proximity of each other.

Figure 9:
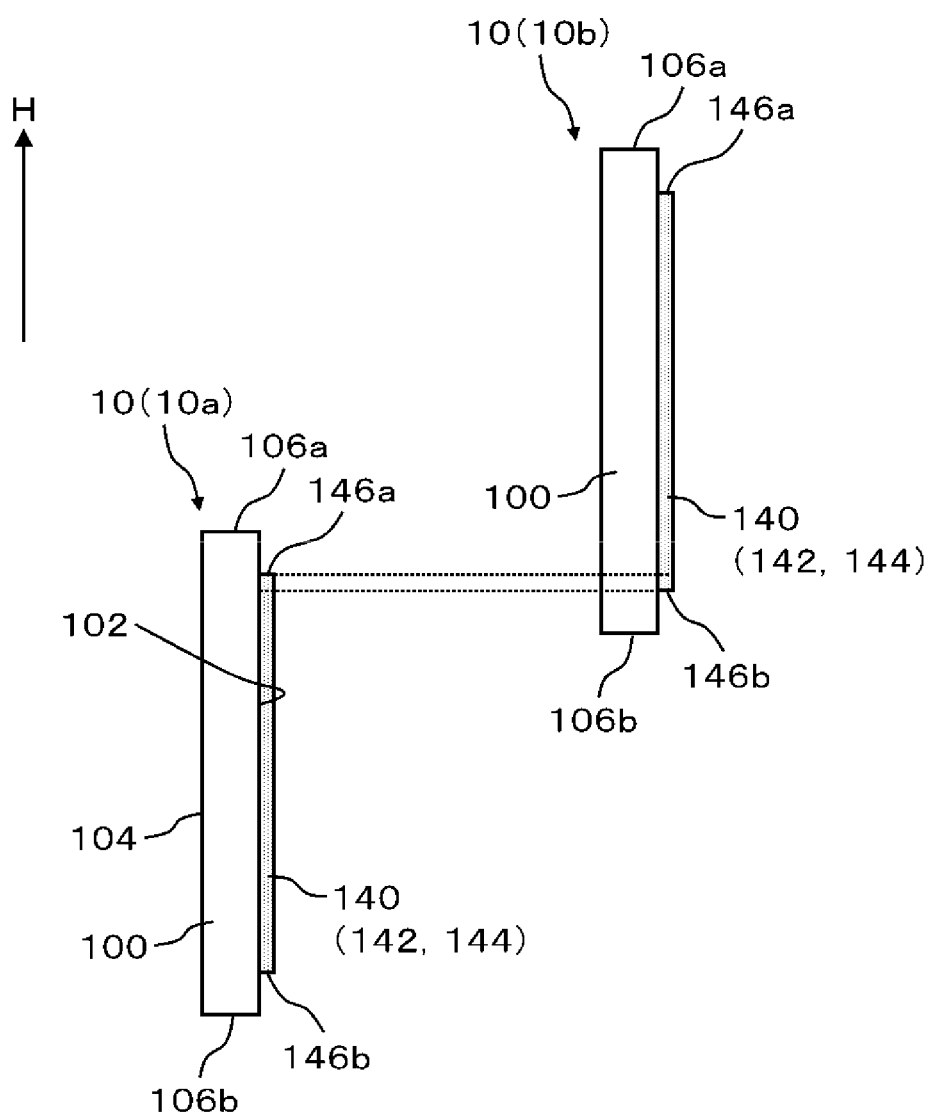
FIG. 9 is a diagram to explain a second example of the relation between the first light-emitting member and the second light-emitting member shown in FIG. 7.

FIG. 9 is a diagram to explain a second example of the relation between the first light-emitting member 10*a* and the second light-emitting member 10*b* shown in FIG. 7.

In the direction H, the light-emitting region 140 of the first light-emitting member 10*a* and the light-emitting region 140 of the second light-emitting member 10*b* are in proximity of each other more than the example shown in FIG. 8. Specifically, in the direction H, the second edge 146*b* of the light-emitting region 140 of the second light-emitting member 10*b* is located shifted from the first edge 146*a* of the light-emitting region 140 of the first light-emitting member 10*a* toward the second edge 146*b* side of the light-emitting region 140 of the first light-emitting member 10*a*. Particularly in the example shown in FIG. 9, the second edge 146*b* of the light-emitting region 140 of the second light-emitting member 10*b* is located between the first edge 146*a* and the second edge 146*b* of the first light-emitting member 10*a*. As is the case with the example above, in the direction H, the first edge 146*a* of the light-emitting region 140 of the first light-emitting member 10*a* is located shifted from the second edge 146*b* of the light-emitting region 140 of the second light-emitting member 10*b* toward the first edge 146*a* side of the light-emitting region 140 of the second light-emitting member 10*b*. Particularly in the example shown in FIG. 9, the first edge 146*a* of the light-emitting region 140 of the first light-emitting member 10*a* is located between the second edge 146*b* and the first edge 146*a* of the second light-emitting member 10*b*.

In another example, the second edge 146*b* of the light-emitting region 140 of the second light-emitting member 10*b* may be aligned with the first edge 146*a* of the light-emitting region 140 of the first light-emitting member 10*a* in the direction H. As is the case with the example above, the first edge 146*a* of the light-emitting region 140 of the first light-emitting member 10*a* may be aligned with the second edge 146*b* of the light-emitting region 140 of the second light-emitting member 10*b* in the direction H. In this example also, in the direction H, the light-emitting region 140 of the first light-emitting member 10*a* and the light-emitting region 140 of the second light-emitting member 10*b* are in proximity of each other.

Figure 10:
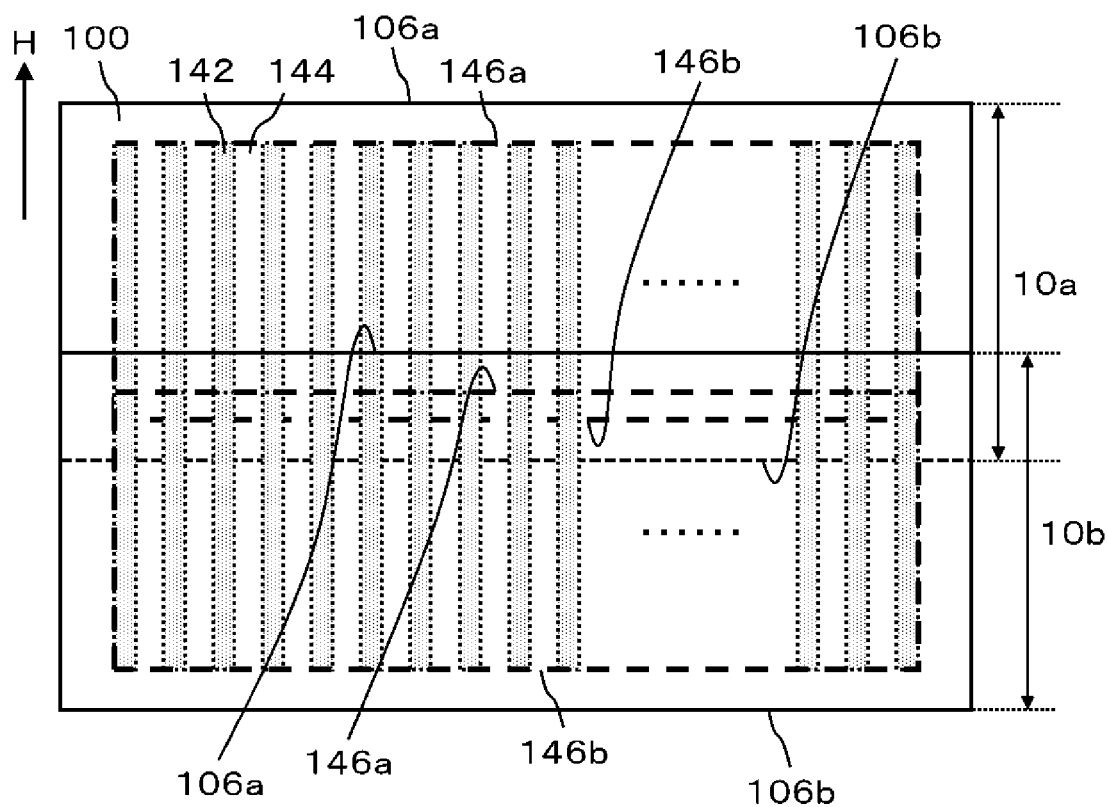
FIG. 10 is a diagram of the first light-emitting member and the second light-emitting member shown in FIG. 9 viewed from the second surface side of the substrate.

FIG. 10 is a diagram of the first light-emitting member 10*a* and the second light-emitting member 10*b* shown in FIG. 9 viewed from the second surface 104 side of the substrate 100.

As shown in FIG. 10, when the first light-emitting member 10*a* and the second light-emitting member 10*b* are viewed from the second surface 104 side of the substrate 100, the light-emitting region 140 of the first light-emitting member 10*a* may be aligned with the light-emitting region 140 of the second light-emitting member 10*b* in the direction H. In a case where the first light-emitting member 10*a* and the second light-emitting member 10*b* are viewed from the second surface 104 side of the substrate 100, the light-emitting region 140 of the first light-emitting member 10*a* and the light-emitting region 140 of the second light-emitting member 10*b* can be disposed so that the light-emitting unit 142 is continuously linear in the direction H. In addition, reduction in transmittance may be inhibited in a region where the first light-emitting member 10*a* and the second light-emitting member 10*b* overlap by aligning each light-transmitting unit 144 with each other.

Figure 11:
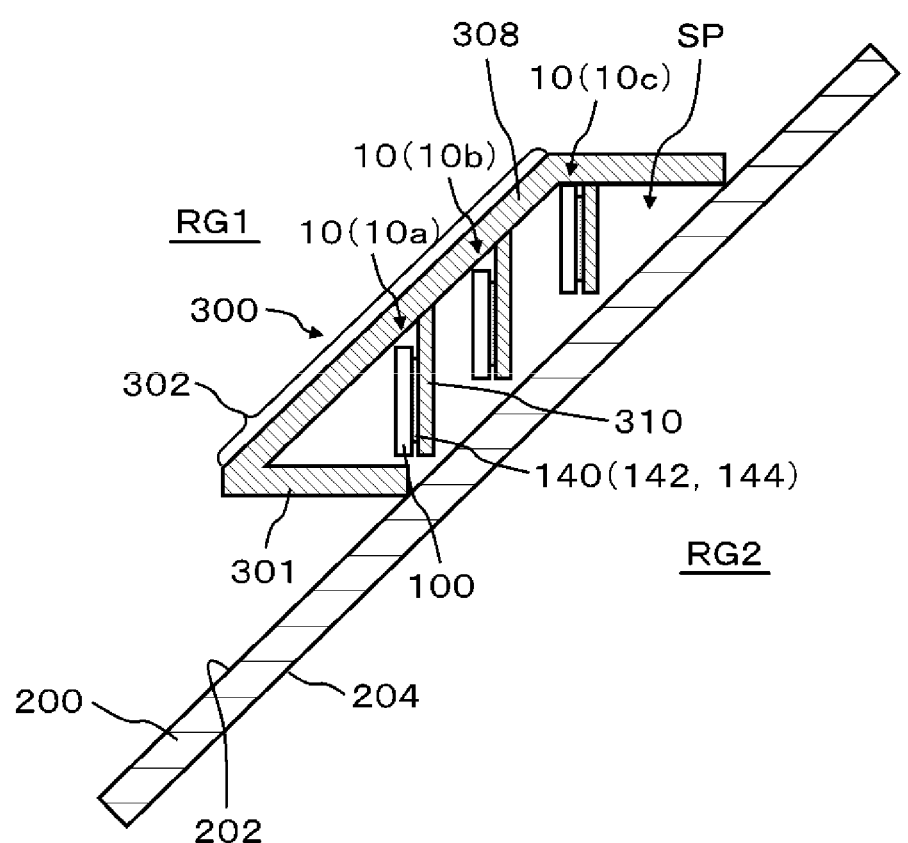
FIG. 11 is a diagram showing a first modification example of FIG. 7.

FIG. 11 is a diagram of the first modification example of FIG. 7.

The cover 300 includes the portion 302. The portion 302 faces each light-emitting member 10 and is located along the outer surface 202 of the base material 200. The portion 302 covers the light-emitting regions 140 of the first light-emitting member 10*a*, the second light-emitting member 10*b*, and the third light-emitting member 10*c*. Therefore, the light-emitting regions 140 of the first light-emitting member 10*a*, the second light-emitting member 10*b*, and the third light-emitting member 10*c* are covered by a member having a common thickness (that is, the portion 302). As shown in FIG. 7, assuming that the light-emitting region 140 of the first light-emitting member 10*a* is covered by a member oriented in the same direction as the substrate 100 (a portion of cover 300), and the light-emitting regions 140 of the second light-emitting member 10*b* and the third light-emitting member 10*c* are covered by a member oriented in a direction inclined from the substrate 100 (portion 302), variation may occur in luminance due to a difference in thicknesses of the cover 300. In contrast, in the example shown in FIG. 11, such variation in luminance can be inhibited.

Figure 12:
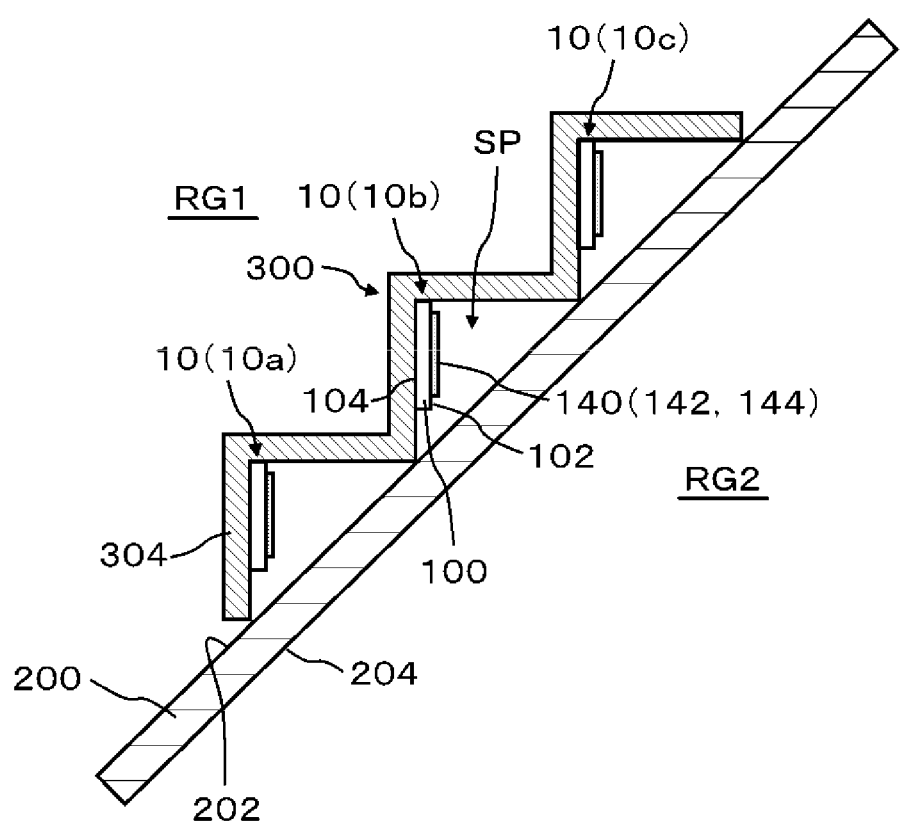
FIG. 12 is a diagram showing a second modification example of FIG. 7.

FIG. 12 is a diagram of the second modification example of FIG. 7.

The cover 300 includes a plurality of portions 304, and each of the plurality of portions 304 faces the same direction, specifically, toward the back of an automobile. Each of the plurality of light-emitting members 10 faces a respective one of the plurality of portions 304. Particularly in the example shown in FIG. 12, the second surface 104 of the substrate 100 is installed on the portion 304. In the example shown in FIG. 12, the thicknesses of the members covering each light-emitting region 140 (that is, each of the portions 304) can be uniformly equalized. Therefore, variation in luminance that may occur due to a difference in thickness of the cover 300 can be inhibited.

Third Embodiment

Figure 13:
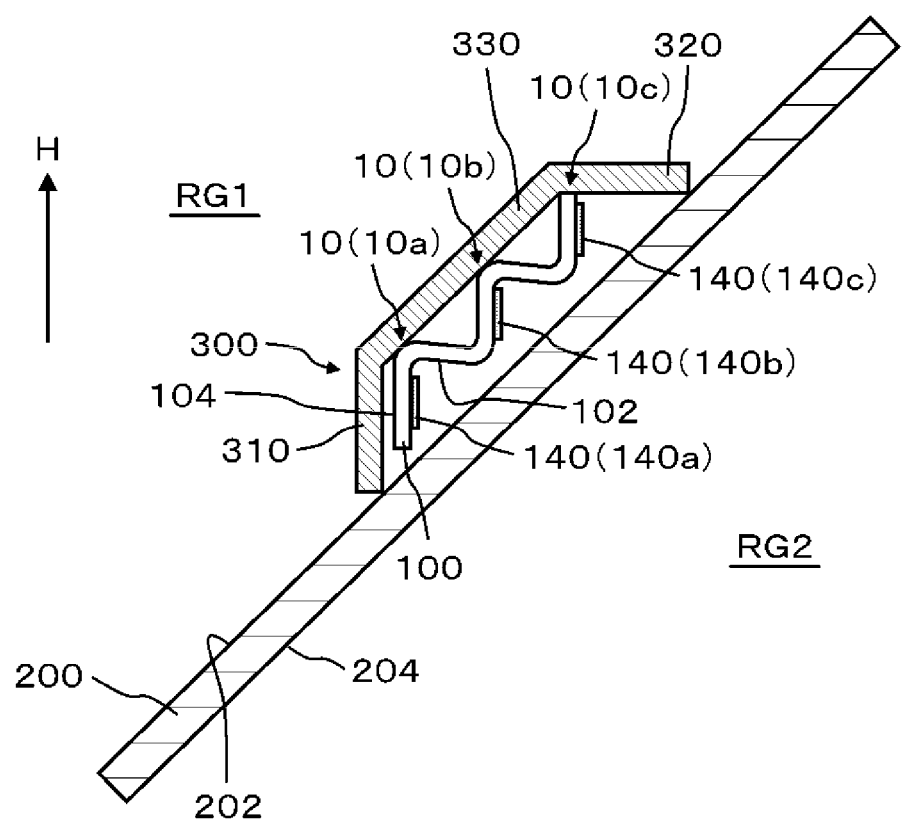
FIG. 13 is a side view showing a light-emitting device according to a third embodiment.
Figure 14:
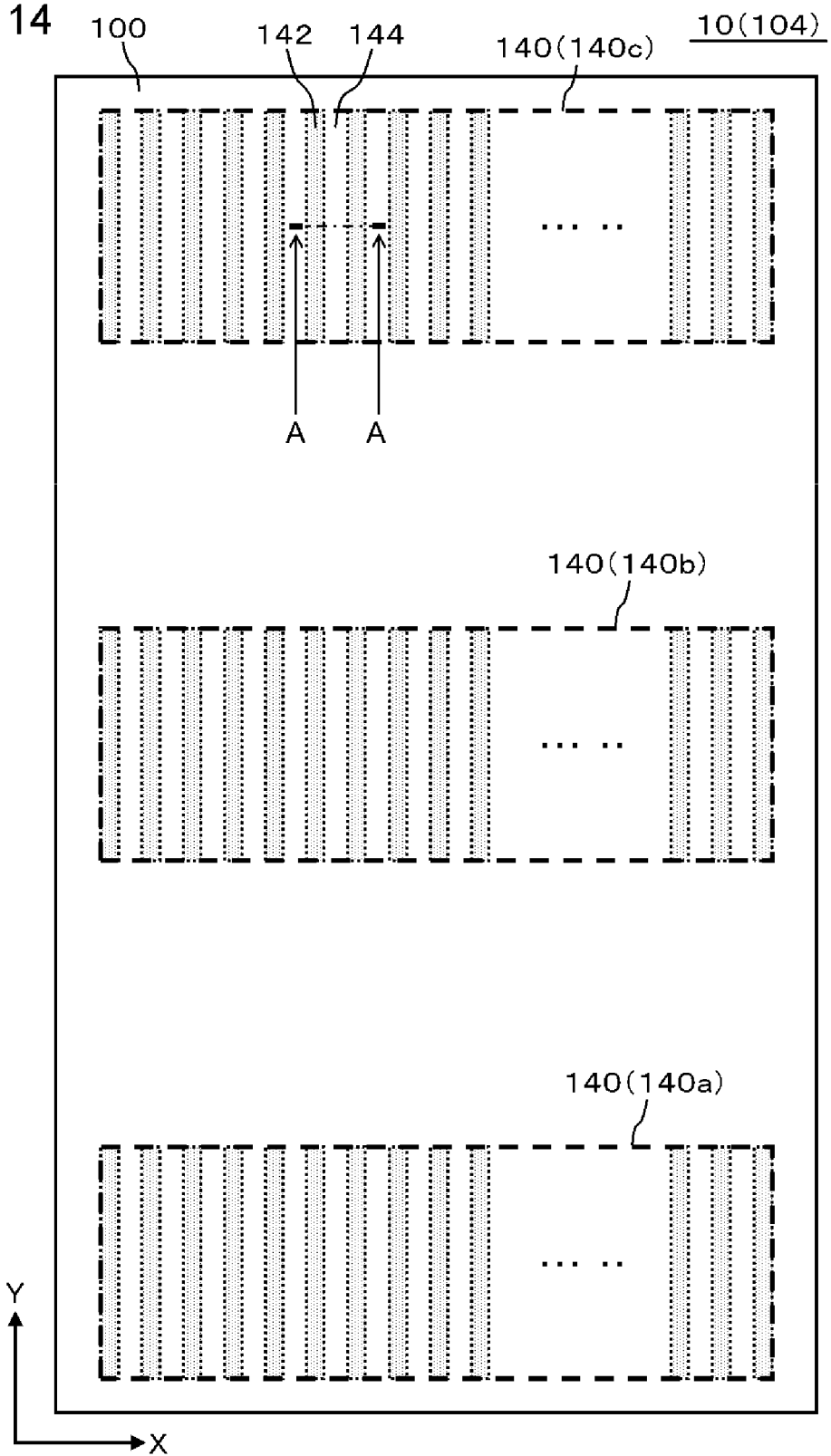
FIG. 14 is a plan view of the light-emitting member shown in FIG. 12 when viewed from the second surface side of the substrate.

FIG. 13 is a side view of a light-emitting device 20 according to the third embodiment, and corresponds to FIG. 7 of the second embodiment. FIG. 14 is a plan view of the light-emitting member 10 shown in FIG. 13 when viewed from the second surface 104 side of the substrate 100. A cross-sectional view taken along line A-A of FIG. 14 is the same as FIG. 3. The light-emitting device 20 according to the present embodiment is the same as the light-emitting device 20 according to the second embodiment except the following.

The light-emitting member 10 includes the plurality of light-emitting regions 140, particularly in the example shown in FIG. 13 and FIG. 14, a first light-emitting region 140a, a second light-emitting region 140b, and a third light-emitting region 140c. As shown in FIG. 14, as is the case with the light-emitting region 140 shown in FIG. 2, each light-emitting region 140 includes the plurality of light-emitting units 142 and the plurality of light-transmitting units 144. The plurality of light-emitting regions 140 are provided on a common substrate, that is, the substrate 100. In other words, the substrate 100 extends across the first light-emitting region 140a, the second light-emitting region 140b, and the third light-emitting region 140c. Particularly in the example shown in FIG. 14, the plurality of light-emitting units 142 and the plurality of light-transmitting units 144 of each light-emitting region 140 correspond to each other along a direction Y.

The substrate 100 has flexibility. Therefore, the shape of the substrate 100 can be changed from the plate shape as shown in FIG. 13. Thus, each light-emitting region 140 can be aligned along the outer surface 202 of the base material 200 and inclined with respect to the outer surface 202 of the base material 200. In addition, the striped directions in the first light-emitting region 140a, the second light-emitting region 140b, and the third light-emitting region 140c corresponds to each other along the direction H. Therefore, in the direction H, each light-emitting region 140 may be disposed so that the light-emitting unit 142 is continuously linear in the direction H. Further, since the first light-emitting region 140a, the second light-emitting region 140b, and the third light-emitting region 140c are formed on the substrate 100, alignment can be easily performed.

Meanwhile, the first light-emitting region 140a and the second light-emitting region 140b may be disposed similarly to the light-emitting region 140 of the first light-emitting member 10a and the light-emitting region 140 of the second light-emitting member 10b shown in FIG. 8, or may be disposed similarly to the light-emitting region 140 of the first light-emitting member 10a and the light-emitting region 140 of the second light-emitting member 10b shown in FIG. 9.

Fourth Embodiment

Figure 15:
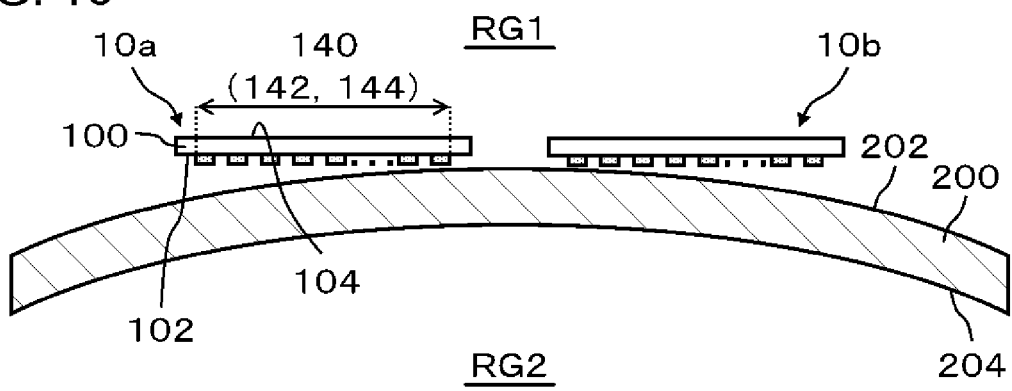
FIG. 15 is a top view showing a light-emitting device according to a fourth embodiment.

FIG. 15 is a top view of a light-emitting device 20 according to the fourth embodiment. The light-emitting device 20 according to the present embodiment is the same as the light-emitting device 20 according to the first embodiment except the following.

The base material 200 is the rear glass of an automobile and partitions a region outside the automobile (region RG1) from a region inside the automobile (region RG2). The base material 200 is convexly curved toward the region RG1 side, that is, toward the outside of the automobile.

The plurality of light-emitting members 10, that is, the first light-emitting member 10a and the second light-emitting member 10b are located on the region RG1 side, that is, the outside of the automobile. The first light-emitting member 10a and the second light-emitting member 10b are aligned in the width direction of the automobile along the outer surface 202 of the base material 200. In the example shown in FIG. 15, the long side direction of the light-emitting region 140 shown in FIG. 2 is along the width direction of the automobile. The light-emitting regions 140 of the first light-emitting member 10a and the second light-emitting member 10b are located on one surface (first surface) of the base material 200, and particularly in the example shown in FIG. 15, are located on the outer surface 202 side and have an inclination with respect to the one surface (outer surface 202 in the example shown in FIG. 15). Therefore, the emission direction of light emitted from the light-emitting region 140 can be determined without depending on the orientation of the outer surface 202 of the base material 200.

Fifth Embodiment

Figure 16:
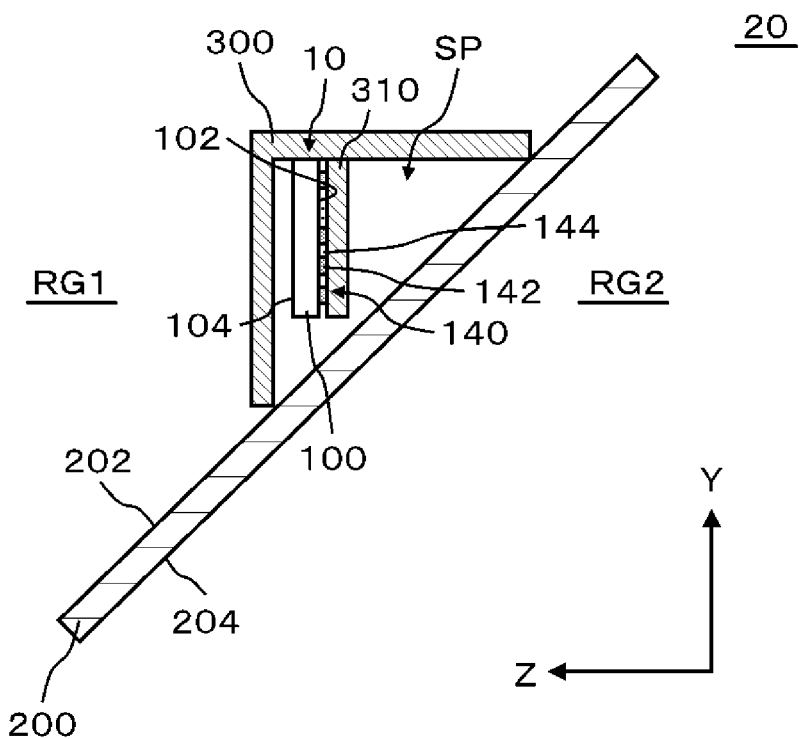
FIG. 16 is a side view showing a light-emitting device according to a fifth embodiment.
Figure 17:
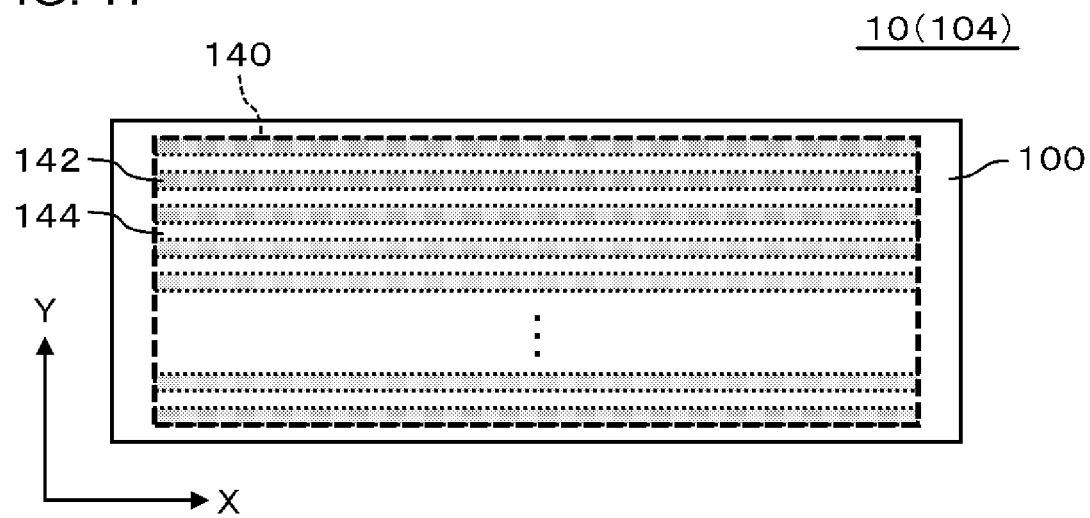
FIG. 17 is a plan view of the light-emitting member shown in FIG. 16 when viewed from the second surface side of the substrate.

FIG. 16 is a top view of the light-emitting device 20 according to a fifth embodiment. FIG. 17 is a plan view of the light-emitting member 10 shown in FIG. 16 when viewed from the second surface 104 side of the substrate 100. The light-emitting device 20 according to the present embodiment is the same as the light-emitting device 20 according to the first embodiment except the following.

In FIG. 16 and FIG. 17, an X direction shows the width direction of the mobile object (for example, an automobile), a Y direction shows the height direction of the mobile object (for example, an automobile), and a Z direction shows the direction along the traveling direction of the mobile object (for example, an automobile).

The plurality of light-emitting units 142 are aligned along the inclination direction (Y direction) of the light-emitting region 140 with respect to the outer surface 202 of the base material 200 and extend in one direction (X direction) to intersect the inclination direction. In the example shown in FIG. 16 and FIG. 17 also, the emission direction of light emitted from the light-emitting region 140 can be determined without depending on the orientation of the outer surface 202 of the base material 200.

In the example shown in FIG. 17, the plurality of light-emitting units 142 and the plurality of light-transmitting units 144 extend in the extending direction (X direction) of the long side of the substrate 100 and are aligned along the extending direction (Y direction) of the short side of the substrate 100. The light-emitting region 140 is longer in the direction along the extending direction (X direction) of the long side of the substrate 100 than in the direction along the extending direction (Y direction) of the short side of the substrate 100.

Figure 18:
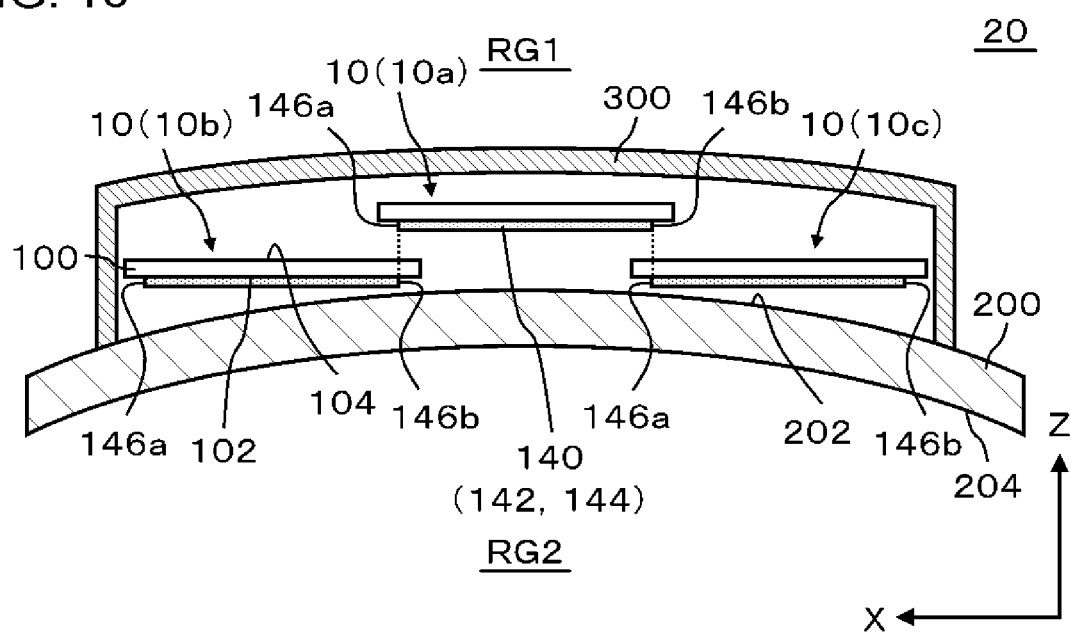
FIG. 18 is a top view showing one example of the light-emitting device shown in FIG. 16.

FIG. 18 is a top view of one example of the light-emitting device 20 shown in FIG. 16.

In the example shown in FIG. 18, three light-emitting members 10, that is, the first light-emitting member 10a, the second light-emitting member 10b, and the third light-emitting member 10c are aligned. The light-emitting region 140 of each light-emitting member 10 includes a first edge 146a and a second edge 146b on the opposite sides of each other. The first edges 146a of each light-emitting member 10 face the same direction (left side of FIG. 18), and the second edges 146b of the light-emitting members 10 face the opposite side of the first edges 146a (right side of FIG. 18).

In the example shown in FIG. 18, viewed from the back of the mobile object, an apparent light-emitting region 140 continues without interruption from the first light-emitting member 10a to the second light-emitting member 10b and the third light-emitting member 10c. Specifically, the first light-emitting member 10a is shifted toward the back of the mobile object from the second light-emitting member 10b and the third light-emitting member 10c in the Z direction. The first edge 146a and the second edge 146b of the first light-emitting member 10a are aligned with the second edge 146b of the second light-emitting member 10b and the first edge 146a of the third light-emitting member 10c, respectively, in the Z direction. Therefore, viewed from the back of the mobile object, the apparent light-emitting region 140 continues without interruption from the first light-emitting member 10a to the second light-emitting member 10b and the third light-emitting member 10c.

In another example, a portion (first edge 146a and the vicinity thereof) and another portion (second edge 146b and the vicinity thereof) of the light-emitting region 140 of the first light-emitting member 10a may overlap a portion (second edge 146b and the vicinity thereof) of the light-emitting region 140 of the second light-emitting member 10b and a portion (first edge 146a and the vicinity thereof) of the light-emitting region 140 of the third light-emitting member 10c in the Z direction. In this example also, viewed from the back of the mobile object, the apparent light-emitting region 140 continues without interruption from the first light-emitting member 10a to the second light-emitting member 10b and the third light-emitting member 10c.

The plurality of light-emitting members 10 may emit light of the same color, or light of colors that are different from each other. For example, the first light-emitting member 10a may emit red light, and the second light-emitting member 10b and the third light-emitting member 10c may emit amber light or yellow light.

In the example shown in FIG. 18, each of the plurality of light-emitting members 10 includes the plurality of light-emitting units 142 aligned in the Y direction (that is, the height direction of the mobile object). However, in another example, both of the light-emitting member 10 which includes the plurality of light-emitting units 142 aligned in the X direction (that is, the width direction of the mobile object) (for example, FIG. 2) and the light-emitting member 10 which includes the plurality of light-emitting units 142 aligned in the Y direction (that is, the height direction of the mobile object) (for example, FIG. 17) may be installed on the base material 200.

Sixth Embodiment

Figure 19:
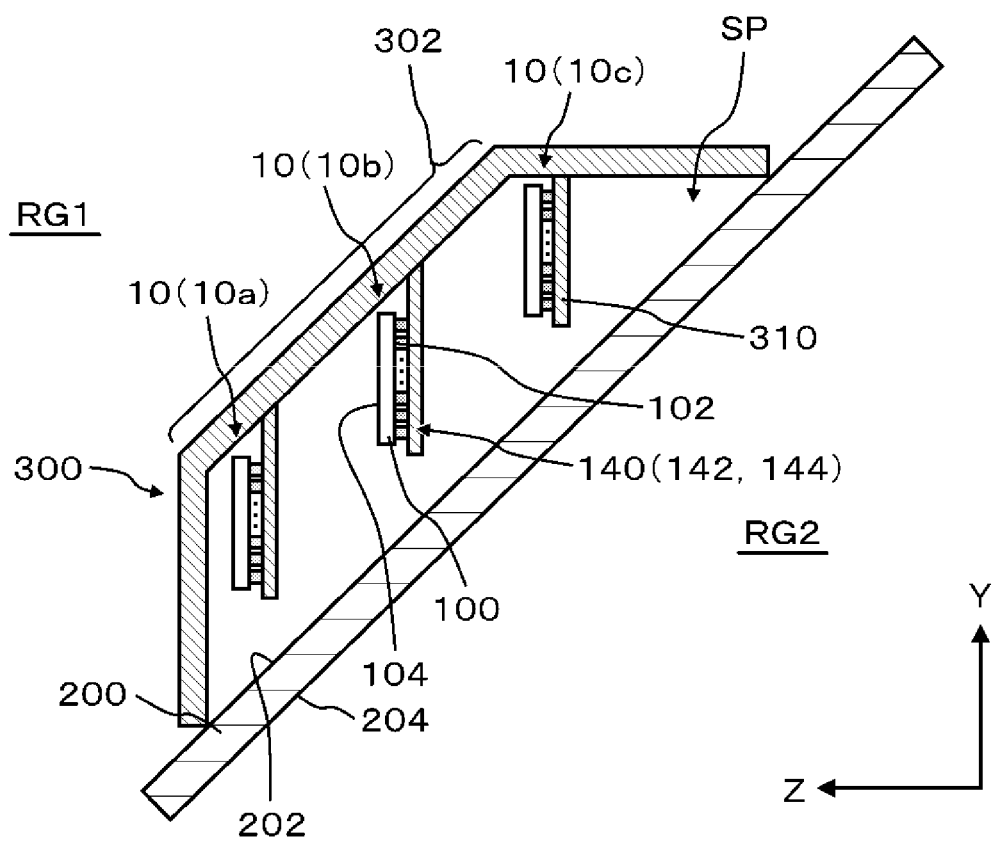
FIG. 19 is a side view showing a light-emitting device according to a sixth embodiment.

FIG. 19 is a side view of a light-emitting device 20 according to the sixth embodiment. The light-emitting device 20 according to the present embodiment is the same as the light-emitting member 10 according to the fifth embodiment except the following.

As is the case with the example shown in FIG. 7, the cover 300 defines the space SP, and the plurality of light-emitting members 10, that is, the first light-emitting member 10a, the second light-emitting member 10b, and the third light-emitting member 10c are located in the space SP. As is the case with the example shown in FIG. 16 and FIG. 17, the plurality of light-emitting units 142 are aligned along the inclination direction (Y direction) of the light-emitting region 140 with respect to the outer surface 202 of the base material 200 and extended in one direction (X direction) intersecting the inclination direction.

The plurality of light-emitting members 10 may emit light of the same color, or light of colors that are different from each other. For example, the first light-emitting member 10a may emit red light, the second light-emitting member 10b may emit amber light, and the third light-emitting member 10c may emit yellow light.

Figure 20:
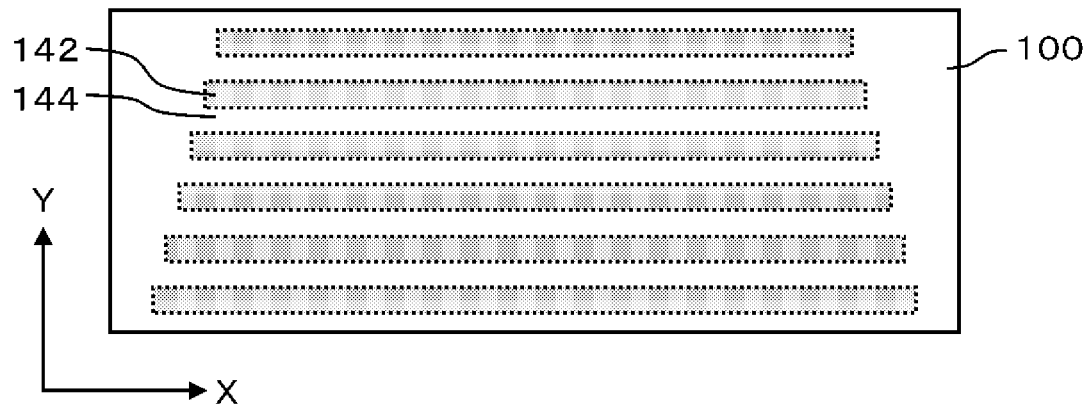
FIG. 20 is a first example of a plan view of the light-emitting member shown in FIG. 19 when viewed from the second surface side of the substrate.

FIG. 20 is a first example of a plan view of the light-emitting member 10 shown in FIG. 19 when viewed from the second surface 104 side of the substrate 100.

The plurality of light-emitting units 142 have lengths that are different from each other in the X direction. In detail, the length of each light-emitting unit 142 in the X direction becomes longer in the light-emitting unit 142 which is closer to the base material 200 (FIG. 19) (the lower side of FIG. 20 in the example shown in FIG. 20) in the Y direction. Therefore, the plurality of light-emitting units 142 include a first light-emitting unit (any of the plurality of light-emitting units 142) and a second light-emitting unit (any of the other plurality of light-emitting units 142), the second light-emitting unit is located closer to the base material 200 than the first light-emitting unit in the Y direction, and the length of the first light-emitting unit in the X direction is shorter than the length of the second light-emitting unit in the X direction.

Figure 21:
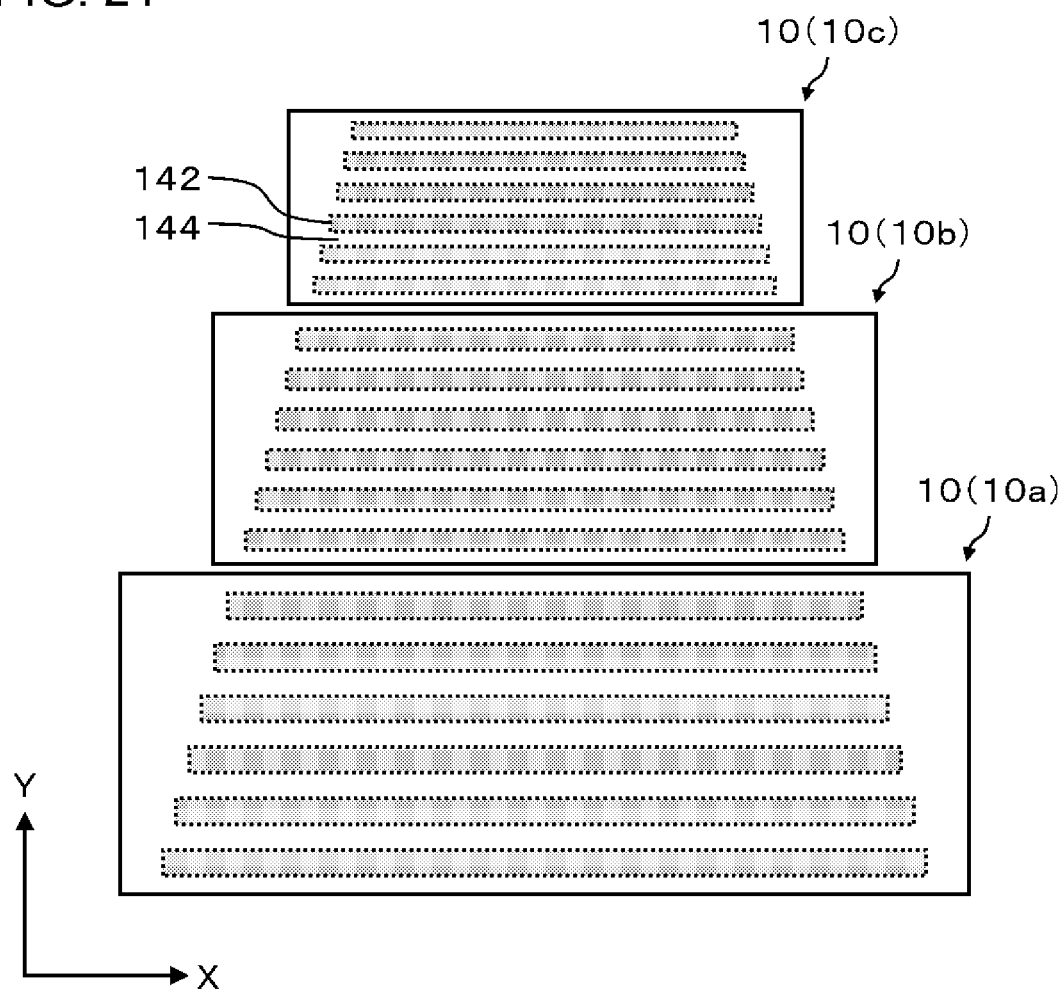
FIG. 21 is a diagram to explain the apparent shape and measurements of a first light-emitting member, a second light-emitting member, and a third light-emitting member according to the example shown in FIG. 20.

FIG. 21 is a diagram to explain the apparent shapes and measurements of the first light-emitting member 10a, the second light-emitting member 10b, and the third light-emitting member 10c according to the example shown in FIG. 20.

The first light-emitting member 10a, the second light-emitting member 10b, and the third light-emitting member 10c actually have substantially the same shape and measurements. However, the apparent shapes and measurements of the first light-emitting member 10a, the second light-emitting member 10b, and the third light-emitting member 10c when viewed from the back of the mobile object have different shapes and measurements as shown in FIG. 21. Specifically, the apparent shape and measurements of each light-emitting member 10 become smaller in the light-emitting member 10 which is located farther from the back of the mobile object. In the example shown in FIG. 19 and FIG. 21, out of the first light-emitting member 10a, the second light-emitting member 10b, and the third light-emitting member 10c, the first light-emitting member 10a is located closest to the back of the mobile object and the third light-emitting member 10c is located farthest from the back of the mobile object.

In the example shown in FIG. 21, a feeling of unity can be obtained in the apparent shapes and measurements of the plurality of light-emitting units 142. Specifically, in each light-emitting member 10, the length of each light-emitting unit 142 in the X direction becomes longer in the light-emitting unit 142 which is closer to the base material 200 (FIG. 19) in the Y direction. Therefore, as shown in FIG. 21, the apparent length of each light-emitting unit 142 in the X direction can be made gradually shorter from the first light-emitting member 10a to the third light-emitting member 10c. Assuming that respective lengths of respective light-emitting units 142 in the X direction are the same, the apparent length of each light-emitting unit 142 in the X direction would greatly vary from the first light-emitting member 10*a* to the second light-emitting member 10*b* and from the second light-emitting member 10*b* to the third light-emitting member 10*c*, and the feeling of unity in the apparent shapes and measurements of the plurality of light-emitting units 142 would become impaired. In contrast, in the example shown in FIG. 21, as described above, the feeling of unity can be obtained in the apparent shapes and measurements of the plurality of light-emitting units 142.

Figure 22:
FIG. 22 is a second example of a plan view of the light-emitting member shown in FIG. 19 when viewed from the second surface side of the substrate.

FIG. 22 is a second example of a plan view of the light-emitting member 10 shown in FIG. 19 when viewed from the second surface 104 side of the substrate 100.

The plurality of light-emitting units 142 have widths that are different from each other in the Y direction. In detail, the width of each light-emitting unit 142 in the Y direction becomes wider in the light-emitting unit 142 which is closer to the base material 200 in the Y direction (FIG. 19) (the lower side of FIG. 22 in the example shown in FIG. 22). Therefore, the plurality of light-emitting units 142 include the first light-emitting unit (any of the plurality of light-emitting units 142) and the second light-emitting unit (any of the other plurality of light-emitting units 142). The second light-emitting unit is located closer to the base material 200 in the Y direction than the first light-emitting unit, and the width of the first light-emitting unit in the Y direction is narrower than the width of the second light-emitting unit in the Y direction.

Figure 23:
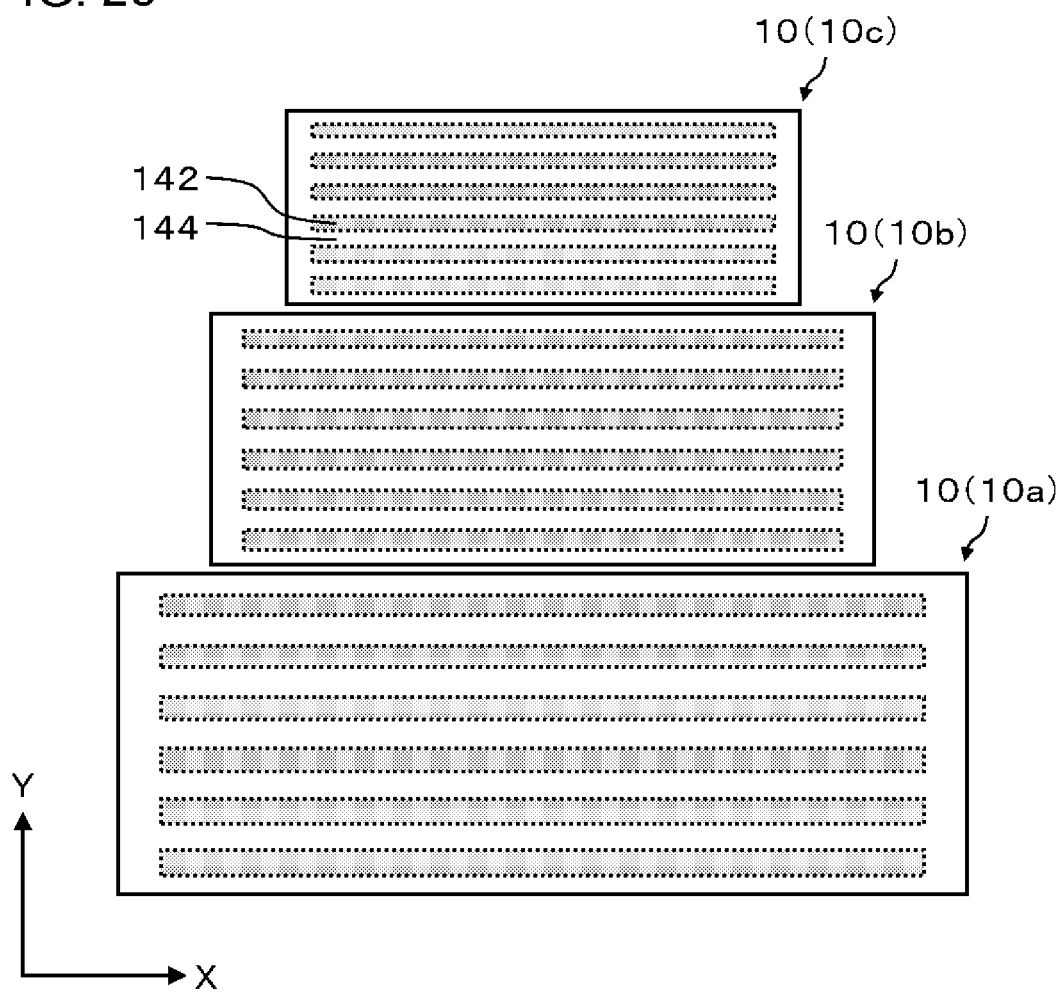
FIG. 23 is a diagram to explain the apparent shape and measurements of a first light-emitting member, a second light-emitting member, and a third light-emitting member according to the example shown in FIG. 22.

FIG. 23 is a diagram to explain the apparent shapes and measurements of the first light-emitting member 10*a*, the second light-emitting member 10*b*, and the third light-emitting member 10*c* according to the example shown in FIG. 22.

In the example shown in FIG. 23, a feeling of unity can be obtained in the apparent shapes and measurements of the plurality of light-emitting units 142. Specifically, in each light-emitting member 10, the width of each light-emitting unit 142 in the Y direction becomes wider in the light-emitting unit 142 which is closer to the base material 200 (FIG. 19) in the Y direction. Therefore, as shown in FIG. 23, the apparent width of each light-emitting unit 142 in the Y direction can be made gradually narrower from the first light-emitting member 10*a* to the third light-emitting member 10*c*. Assuming that respective widths of respective light-emitting units 142 in the Y direction are the same, the apparent width of each light-emitting unit 142 in the Y direction greatly varies from the first light-emitting member 10*a* to the second light-emitting member 10*b* and from the second light-emitting member 10*b* to the third light-emitting member 10*c*, and the feeling of unity would become impaired in the apparent shapes and measurements of the plurality of light-emitting units 142. In contrast, in the example shown in FIG. 23, as described above, the feeling of unity can be obtained in the apparent shapes and measurements of the plurality of light-emitting units 142.

Figure 24:
FIG. 24 is a third example of a plan view of the light-emitting member shown in FIG. 19 when viewed from the second surface side of the substrate.

FIG. 24 is a third example of a plan view of the light-emitting member 10 shown in FIG. 19 when viewed from the second surface 104 side of the substrate 100.

As is the case with the example shown in FIG. 20, the length of each light-emitting unit 142 in the X direction becomes longer in the light-emitting unit 142 which is closer to the base material 200 in the Y direction (FIG. 19) (the lower side of FIG. 24 in the example shown in FIG. 24). As is the case with the example shown in FIG. 22, the width of each light-emitting unit 142 in the Y direction becomes wider in the light-emitting unit 142 which is closer to the base material 200 in the Y direction (FIG. 19) (the lower side of FIG. 24 in the example shown in FIG. 24).

Figure 25:
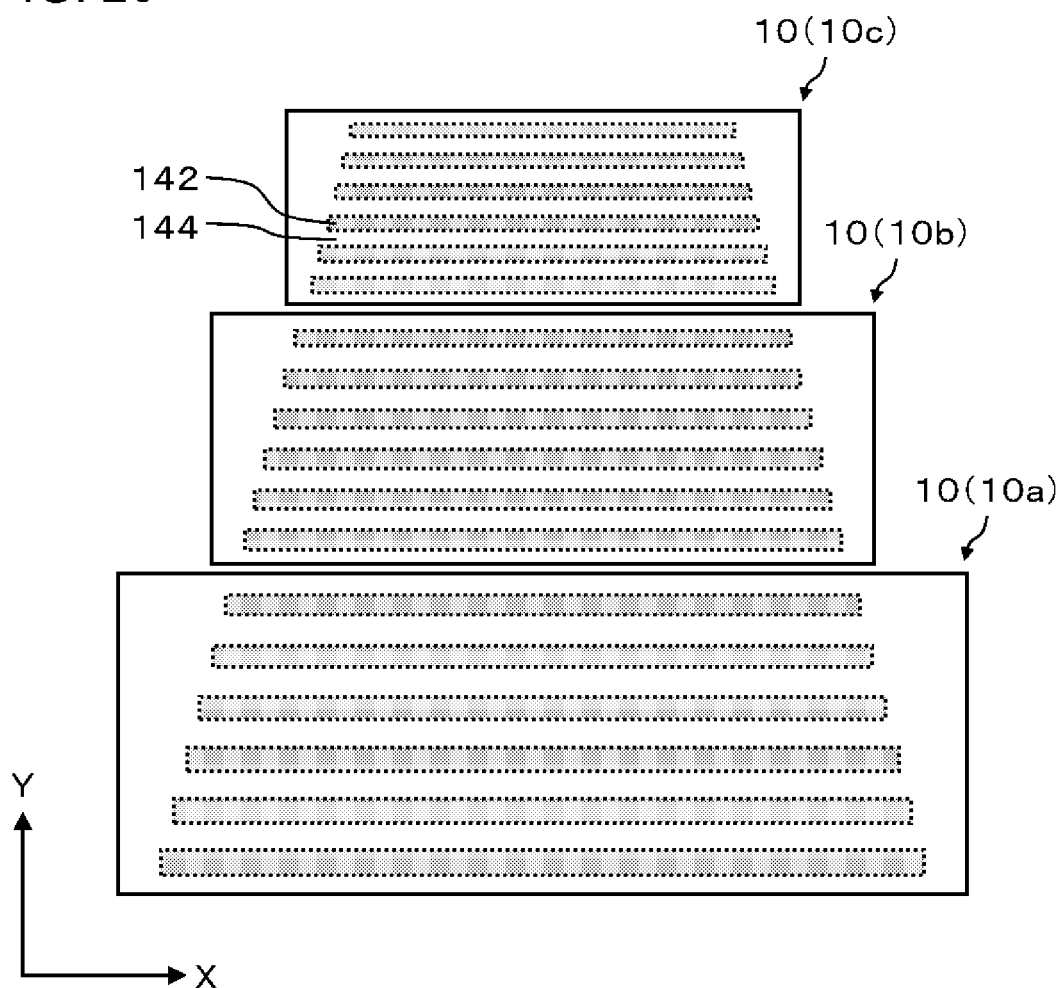
FIG. 25 is a diagram to explain the apparent shape and measurements of a first light-emitting member, a second light-emitting member, and a third light-emitting member according to the example shown in FIG. 24.

FIG. 25 is a diagram to explain the apparent shapes and measurements of the first light-emitting member 10*a*, the second light-emitting member 10*b*, and the third light-emitting member 10*c* according to the example shown in FIG. 24.

As is the case with the example shown in FIG. 21, the apparent length of each light-emitting unit 142 in the X direction can be made gradually shorter from the first light-emitting member 10*a* to the third light-emitting member 10*c*. In addition, as is the case with the example shown in FIG. 23, the apparent width of each light-emitting unit 142 in the Y direction can be made gradually narrower from the first light-emitting member 10*a* to the third light-emitting member 10*c*. Therefore, the feeling of unity can be obtained in the apparent shapes and measurements of the plurality of light-emitting units 142. In addition, as shown in FIG. 19, even when the light-emitting region 140 of each of the first light-emitting member 10*a*, the second light-emitting member 10*b*, and the third light-emitting member 10*c* is actually inclined from the outer surface 202 of the base material 200, according to the apparent layout in FIG. 25, each light-emitting unit 142 may appear to be aligned along the outer surface 202 of the base material 200 from the first light-emitting member 10*a* to the third light-emitting member 10*c*.

Figure 26:
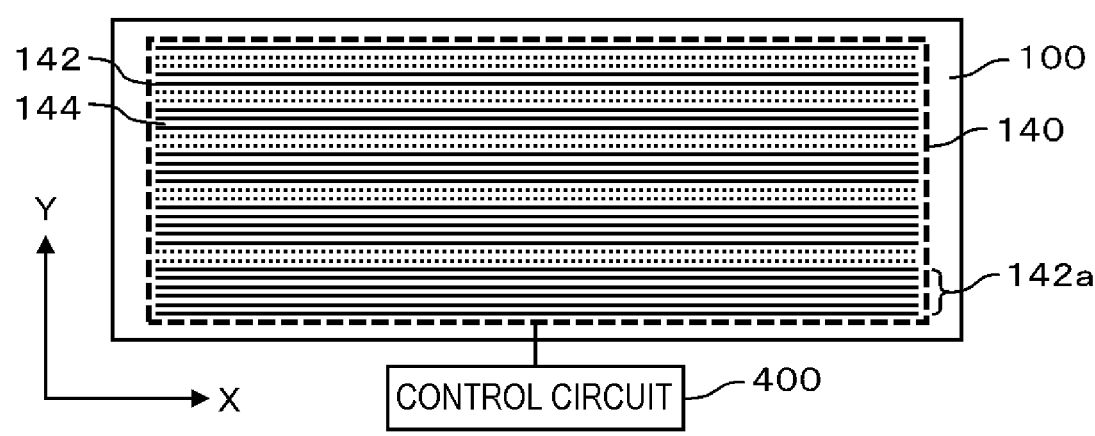
FIG. 26 is a fourth example of a plan view of the light-emitting member shown in FIG. 19 when viewed from the second surface side of the substrate.

FIG. 26 is a fourth example of a plan view of the light-emitting member 10 shown in FIG. 19 when viewed from the second surface 104 side of the substrate 100.

The light-emitting member 10 includes a control circuit 400. The control circuit 400 controls the light-emitting region 140, and specifically, selects the light-emitting units 142 out of the plurality of light-emitting units 142 to emit light. In FIG. 26, the light-emitting units 142 (light-emitting units 142 emitting light) selected by the control circuit 400 are indicated by solid lines, and the light-emitting units 142 (light-emitting units 142 not emitting light) which are not selected by the control circuit 400 are indicated by broken lines.

The light-emitting region 140 includes a plurality of selected light-emitting regions 142*a*. Each of the selected light-emitting regions 142*a* contains one or the plurality of light-emitting units 142 selected by the control circuit 400. In a case where the plurality of light-emitting units 142 are aligned at a narrow pitch (for example, a pitch of equal to or less than 0.50 mm), respective ones of the plurality of selected light-emitting regions 142*a* can have, for example, the apparent shapes and measurements which are similar to respective ones of the plurality of light-emitting units 142 shown in FIG. 22.

The plurality of selected light-emitting regions 142*a* have widths that are different from each other in the Y direction. In detail, the width of each of the selected light-emitting regions 142*a* in the Y direction becomes wider in the selected light-emitting region 142*a* which is closer to the base material 200 in the Y direction (FIG. 19) (a lower side of FIG. 26 in the example shown in FIG. 26). Therefore, in the first light-emitting member 10*a*, the second light-emitting member 10*b*, and the third light-emitting member 10*c* according to the example shown in FIG. 26, as is the case with the example shown in FIG. 23, the apparent width of each of the selected light-emitting regions 142*a* in the Y direction can be made gradually narrower from the first light-emitting member 10*a* to the third light-emitting member 10*c*. Therefore, a feeling of unity can be obtained in the apparent shapes and measurements of the plurality of selected light-emitting regions 142a.

As described above, although the embodiments and examples of the present invention have been set forthwith reference to the accompanying drawings, they are merely illustrative of the present invention, and various configurations other than those stated above can be adopted. In the embodiments shown in each diagram described above, respective described contents can be combined unless there particularly is contradiction or a problem in the purpose, configurations there of or the like.

This application claims priority from Japanese Patent Application No. 2017-136757, filed Jul. 13, 2017, the disclosure of which is incorporated by reference in its entirety.

The invention claimed is:

1. A light-emitting device comprising:
a first light-emitting surface comprising a plurality of light-emitting units, and a plurality of light-transmitting units, each light-transmitting unit being located between the light-emitting units adjacent to each other,
wherein the first light-emitting surface is located on a first surface side of a light-transmitting member of a mobile object, emits light toward an outside of the mobile object, and has an inclination with respect to the first surface.

2. The light-emitting device according to claim 1, further comprising a second light-emitting surface comprising a plurality of light-emitting units, and a light-transmitting unit located between the light-emitting units adjacent to each other,
wherein the second light-emitting surface is located on the first surface side of a light-transmitting member of the mobile object, emits light toward an outside of the mobile object, and has an inclination with respect to the first surface, and
wherein the first light-emitting surface and the second light-emitting surface are aligned along the first surface.

3. The light-emitting device according to claim 2, further comprising a first substrate and a second substrate,
wherein the first light-emitting surface and the second light-emitting surface are provided on the first substrate and the second substrate, respectively,
wherein the first substrate has an inclination with respect to the first surface of the light-transmitting member, and
wherein the second substrate has an inclination with respect to the first surface of the light-transmitting member.

4. The light-emitting device according to claim 3, wherein the first light-emitting surface and the second light-emitting surface are aligned in one direction when viewed from a normal direction of the first light-emitting surface,
wherein each of the first light-emitting surface and the second light-emitting surface comprises a first edge and a second edge on an opposite side of the first edge,
wherein the first substrate comprises a first edge along the first edge of the first light-emitting surface,
wherein in the one direction, the first edge of the first light-emitting surface and the second edge of the second light-emitting surface are located between the second edge of the first light-emitting surface and the first edge of the second light-emitting surface, and
wherein in the one direction, the second edge of the second light-emitting surface is aligned with the first edge of the first substrate, or is located shifted from the first edge of the first substrate toward the second edge side of the first light-emitting surface.

5. The light-emitting device according to claim 4, wherein in the one direction, the second edge of the second light-emitting surface is aligned with the first edge of the first light-emitting surface or is located shifted from the first edge of the first light-emitting surface toward the second edge side of the first light-emitting surface.

6. The light-emitting device according to claim 2, further comprising a substrate having flexibility,
wherein the first light-emitting surface and the second light-emitting surface are provided on the substrate, and
wherein the substrate extends from the first light-emitting surface to the second light-emitting surface.

7. The light-emitting device according to claim 2, further comprising a cover, wherein the cover and the light-transmitting member are on opposite sides of the first light-emitting surface and the second light-emitting surface.

8. The light-emitting device according to claim 7, wherein at least a portion of the cover is located along the first surface of the light-transmitting member.

9. The light-emitting device according to claim 1, wherein each of the plurality of light-emitting units comprises a laminated structure comprising a light-transmitting first electrode, an organic layer, and a light-shielding second electrode in order in a direction from an outside toward an inside of the mobile object.

10. The light-emitting device according to claim 1, wherein the first light-emitting surface is located on an outside of the mobile object.

11. The light-emitting device according to claim 1, wherein the light-transmitting member is rear glass of the mobile object, and
wherein the plurality of light-emitting units emit light toward a back of the mobile object.

12. The light-emitting device according to claim 11, wherein a light distribution of light emitted from the plurality of light-emitting units has a peak at an angle of equal to or less than 10° vertically and horizontally from a reference axis along a traveling direction of the mobile object.

13. The light-emitting device according to claim 11, wherein a direction of a peak of a light distribution of light emitted from the plurality of light-emitting units is oriented closer to a reference axis along a traveling direction of the mobile object than to a normal direction of the first surface.

14. The light-emitting device according to claim 1, wherein the plurality of light-emitting units extend in one direction, and
wherein the plurality of light-emitting units have lengths that are different from each other in the one direction.

15. The light-emitting device according to claim 14, wherein the plurality of light-emitting units is aligned along an inclination direction of the first light-emitting surface with respect to the first surface of the light-transmitting member, and the one direction is a direction that intersects the inclination direction.

16. The light-emitting device according to claim 15, wherein the plurality of light-emitting units comprise a first light-emitting unit and a second light-emitting unit located closer to the light-transmitting member than the first light-emitting unit in the inclination direction, and
wherein a length of the first light-emitting unit in the one direction is shorter than a length of the second light-emitting unit in the one direction.

17. The light-emitting device according to claim 1, wherein the plurality of light-emitting units extend in one direction, and
   wherein the plurality of light-emitting units have widths that are different from each other in an inclination direction.

18. The light-emitting device according to claim 17, wherein the plurality of light-emitting units is aligned along an inclination direction of the first light-emitting surface with respect to the first surface of the light-transmitting member, and the one direction is a direction that intersects the inclination direction.

19. The light-emitting device according to claim 18, wherein the plurality of light-emitting units comprise a first light-emitting unit and a second light-emitting unit located closer to the light-transmitting member than the first light-emitting unit in the inclination direction, and
   wherein a width of the first light-emitting unit in the inclination direction is narrower than a width of the second light-emitting unit in the inclination direction.

20. A light-emitting device comprising:
   a first light-emitting surface comprising a plurality of light-emitting units emitting light and a light-transmitting unit located between the light-emitting units adjacent to each other,
   wherein the first light-emitting surface is located on a first surface side of a base material having light-transmitting properties and has an inclination with respect to the first surface of the base material.

\* \* \* \* \*